United States Patent
Kim et al.

(10) Patent No.: US 10,573,389 B2
(45) Date of Patent: Feb. 25, 2020

(54) STORAGE DEVICE HAVING PARAMETER CALIBRATION FUNCTION, AND OPERATING METHOD THEREOF

(71) Applicant: SAMSUNG ELECTRONICS CO., LTD., Suwon-si, Gyeonggi-Do (KR)

(72) Inventors: Chan-Ha Kim, Hwaseong-si (KR); Suk-Eun Kang, Hwaseong-si (KR); Ji-Su Kim, Seoul (KR); Seung-Kyung Ro, Anyang-si (KR); Dong-Gi Lee, Yongin-si (KR); Yun-Jung Lee, Suwon-si (KR); Jin-Wook Lee, Seoul (KR); Hee-Won Lee, Seoul (KR); Joon-Suc Jang, Hwaseong-si (KR); Young-Ha Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/013,988

(22) Filed: Jun. 21, 2018

(65) Prior Publication Data
US 2019/0115078 A1 Apr. 18, 2019

(30) Foreign Application Priority Data
Oct. 17, 2017 (KR) .................. 10-2017-0134811

(51) Int. Cl.
*G11C 16/10* (2006.01)
*G11C 16/34* (2006.01)
(Continued)

(52) U.S. Cl.
CPC ............ *G11C 16/10* (2013.01); *G06K 9/6223* (2013.01); *G06K 9/6226* (2013.01); *G11C 16/08* (2013.01);
(Continued)

(58) Field of Classification Search
CPC ... G11C 16/10; G11C 7/1096; G11C 16/3445; G11C 7/08
(Continued)

(56) References Cited

U.S. PATENT DOCUMENTS 8,760,935 B2 6/2014 Takekida
8,913,431 B1 12/2014 Costa et al.
(Continued)

FOREIGN PATENT DOCUMENTS

| KR | 10-0874013 | 12/2008 |
|----|------------|---------|
| KR | 10-2016-0113051 | 9/2016 |
| KR | 10-2017-0075855 | 7/2017 |

*Primary Examiner* — Han Yang
(74) *Attorney, Agent, or Firm* — Volentine, Whitt & Francos, PLLC

(57) ABSTRACT

An operating method of a storage device includes a controller: receiving read data from a non-volatile memory; measuring a plurality of threshold voltage distributions respectively corresponding to a plurality of memory units of the non-volatile memory, based on the received read data; measuring a distribution variation between the plurality of memory units, based on the measured plurality of threshold voltage distributions; dynamically determining operation parameters for the non-volatile memory, based on the measured distribution variation; and transmitting, to the non-volatile memory, an operate command, an address, and at least one operation parameter corresponding to the address.

20 Claims, 37 Drawing Sheets

(51) Int. Cl.
*G06K 9/62* (2006.01)
*G11C 16/08* (2006.01)
*G11C 8/12* (2006.01)
*G11C 5/06* (2006.01)

(52) U.S. Cl.
CPC ...... *G11C 16/3445* (2013.01); *G11C 16/3459* (2013.01); *G11C 5/063* (2013.01); *G11C 8/12* (2013.01)

(58) Field of Classification Search
USPC .................................. 365/185.13, 185.17
See application file for complete search history.

(56) References Cited

U.S. PATENT DOCUMENTS

| | | | |
|---|---|---|---|
| 8,947,972 B2 | 2/2015 | Balakrishnan et al. | |
| 9,208,886 B2 | 12/2015 | Nam et al. | |
| 9,269,441 B2 | 2/2016 | Aritome | |
| 9,627,075 B1 | 4/2017 | Park | |
| 9,720,754 B2 | 8/2017 | Karakulak et al. | |
| 2008/0266945 A1 | 10/2008 | Hou et al. | |
| 2009/0268517 A1* | 10/2009 | Murin | G11C 11/5628 365/185.03 |
| 2011/0182118 A1 | 7/2011 | Litsyn et al. | |
| 2014/0025866 A1* | 1/2014 | Kim | G06F 12/0246 711/103 |
| 2014/0269059 A1 | 9/2014 | Sridharan et al. | |
| 2016/0125922 A1* | 5/2016 | Chen | G11C 11/5628 365/189.16 |
| 2016/0147582 A1 | 5/2016 | Karakulak et al. | |
| 2017/0083811 A1 | 3/2017 | Cho et al. | |
| 2017/0133107 A1 | 5/2017 | Ryan et al. | |
| 2017/0154680 A1 | 6/2017 | Lee | |
| 2017/0185348 A1 | 6/2017 | Byun | |

* cited by examiner

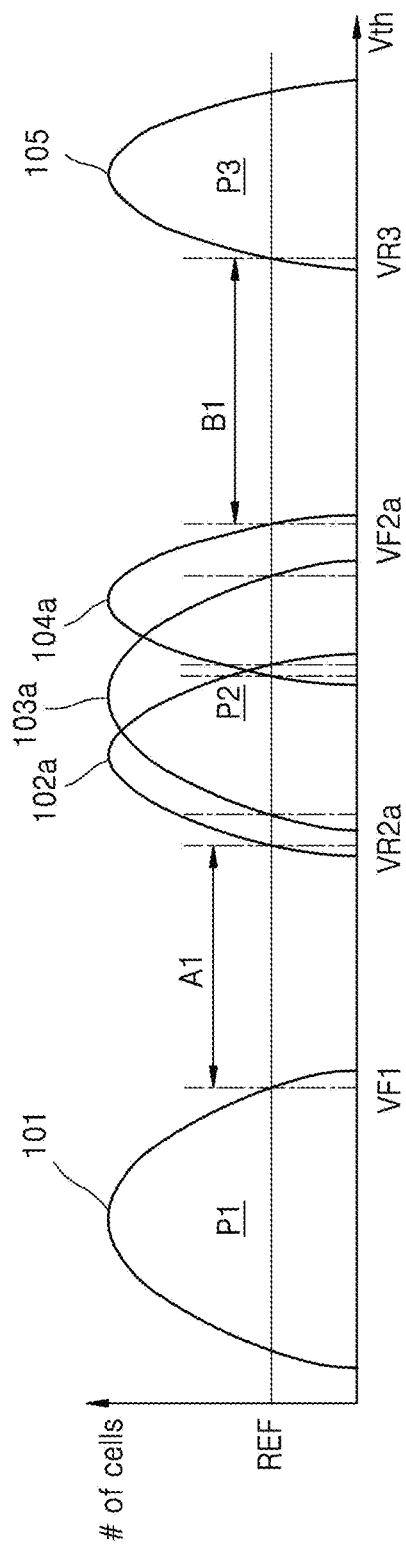

FIG. 13
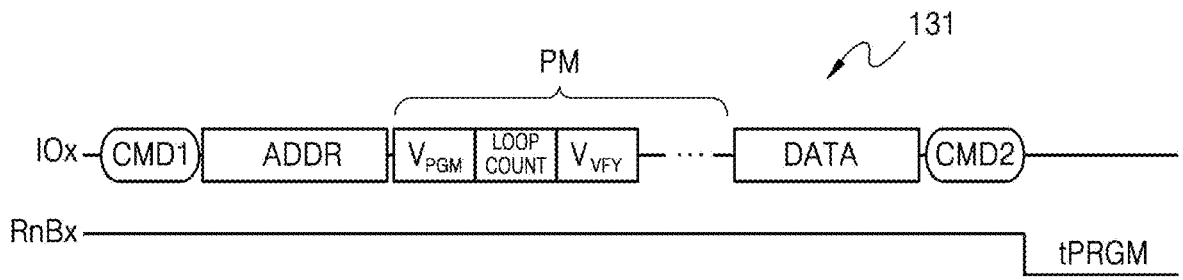
FIG. 14A
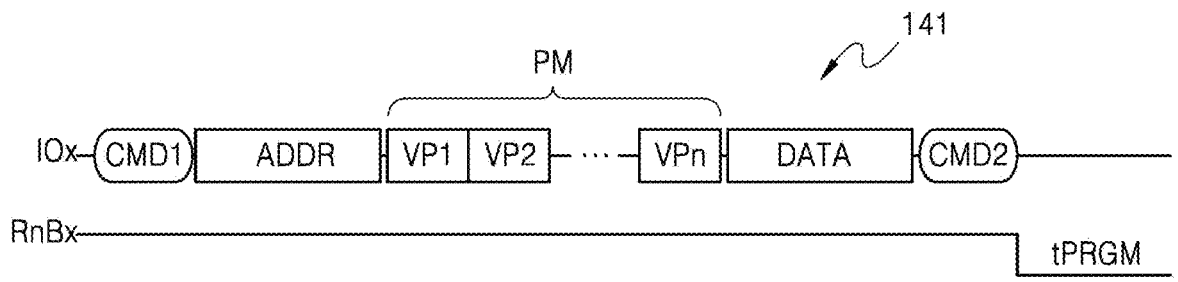
FIG. 14B
VERIFY OFFSET TABLE  142
| WL | VP1 | VP2 | VP3 | ... | VPn |
|---|---|---|---|---|---|
| WL1 | −10 | −20 | −20 | ... | −30 |
| WL2 | −20 | −20 | −30 | ... | −50 |
| WL3 | −30 | −50 | −50 | ... | −60 |
| WL4 | −60 | −70 | −10 | ... | −70 |
| WL5 | −50 | −90 | −30 | ... | −90 |
| ... | | | | | |
| WL64 | −100 | −110 | −10 | ... | −40 |

| WL | VP1 | VP2 | VP3 | ... | VPn |
|---|---|---|---|---|---|
| WGR1 | −10 | −20 | −20 | ... | −30 |
| WGR2 | −60 | −70 | −10 | ... | −70 |
| ... | | | | | |
| WGRa | −100 | −110 | −10 | ... | −40 |

| WL | Vr1 | Vr2 | Vr3 | ... | Vrn |
|---|---|---|---|---|---|
| WGR1 | V11 | V12 | V13 | ... | V1n |
| WGR2 | V21 | V22 | V23 | ... | V2n |
| ... | | | | | |
| WGRa | Va1 | Va3 | Va3 | ... | Van |

STORAGE DEVICE HAVING PARAMETER CALIBRATION FUNCTION, AND OPERATING METHOD THEREOF

CROSS-REFERENCE TO RELATED APPLICATION

This application claims the benefit of Korean Patent Application No. 10-2017-0134811, filed on Oct. 17, 2017, in the Korean Intellectual Property Office, the disclosure of which is incorporated herein in its entirety by reference.

BACKGROUND

The inventive concept relates to a storage device, and more particularly, to a storage device having a parameter calibration function, and an operating method of the storage device.

As a type of non-volatile memory, flash memory maintains stored data even when power is cut off. Flash memory stores data by shifting threshold voltages of memory cells and reads the data by using a predetermined read level. However, the threshold voltages of the memory cells may shift unintentionally, for example due to physical locations or deterioration of the memory cells. Thus, in order to prevent a read error from being caused by the unintentional shift of the threshold voltages, the read level should be dynamically shifted and stored, causing an increase in overhead. Considering the possibility that a plurality of read requests are generated for programmed memory cells, it is necessary to develop an operating method for decreasing overhead of the read operation.

SUMMARY

The inventive concept provides a storage device having a parameter calibration function, and an operating method of the storage device.

According to an aspect of the inventive concept, there is provided an operating method of a storage device including receiving, by a controller, read data from the non-volatile memory, measuring, by the controller, a plurality of threshold voltage distributions respectively corresponding to a plurality of memory units of the non-volatile memory, based on the received read data, measuring, by the controller, a distribution variation between the plurality of memory units, based on the measured plurality of threshold voltage distributions, dynamically determining, by the controller, operation parameters for the non-volatile memory, based on the measured distribution variation, and transmitting, by the controller, an operate command, an address, and at least one operation parameter corresponding to the address, to the non-volatile memory.

According to another aspect of the inventive concept, there is provided an operating method of a storage device, the operating method including receiving, by a controller, read data from the non-volatile memory, measuring, by the controller, a plurality of threshold voltage distributions respectively corresponding to a plurality of memory units of the non-volatile memory, based on the received read data, measuring, by the controller, a distribution variation metric between the plurality of memory units, based on the measured plurality of threshold voltage distributions, dynamically grouping, by the controller, the plurality of memory units into a plurality of groups through clustering based on the measured distribution variation metric, and dynamically determining, by the controller, operation parameters for the non-volatile memory for each of the plurality of groups.

According to another aspect of the inventive concept, there is provided an operating method of a storage device, the operating method including receiving, by a controller, read data from the non-volatile memory, measuring, by the controller, a plurality of threshold voltage distributions respectively corresponding to a plurality of memory units of the non-volatile memory, based on the received read data, measuring, by the controller, a distribution variation between the plurality of memory units, based on the measured plurality of threshold voltage distributions, dynamically grouping, by the controller, the plurality of memory units into a plurality of groups, based on the measured distribution variation, dynamically determining, by the controller, operation parameters for the non-volatile memory for each of the plurality of groups, based on the measured distribution variation, and transmitting, by the controller, an operate command, an address, and at least one operation parameter corresponding to the address, to the non-volatile memory.

According to another aspect of the inventive concept, there is provided a storage device including a non-volatile memory, the storage device including a plurality of memory cells respectively connected to a plurality of word lines; and a controller configured to measure a distribution variation between the plurality of word lines based on a plurality of threshold voltage distributions respectively corresponding to the plurality of word lines, based on read data received from the non-volatile memory, determine operation parameters for the plurality of memory cells for each of groups, based on the measured distribution variation, and transmit an operate command, an address, and at least one operation parameter corresponding to the address, to the non-volatile memory.

According to yet another aspect of the inventive concept, a device comprises: a non-volatile memory including a plurality of non-volatile memory cells arranged in a plurality of memory units; and a controller. The controller is configured to: measure a plurality of threshold voltage distributions respectively corresponding to a plurality of memory units of the non-volatile memory; measure a distribution variation between the plurality of memory units, based on the measured plurality of threshold voltage distributions; and determine operation parameters for the non-volatile memory for each of the plurality of memory units, based on the measured distribution variation.

BRIEF DESCRIPTION OF THE DRAWINGS

Embodiments of the inventive concept will be more clearly understood from the following detailed description taken in conjunction with the accompanying drawings.

FIGS. 10A, 10B, 10c and 10D are graphs showing some embodiments of threshold voltage distribution calibration results.

FIG. 13 illustrates an example embodiment of a program command set.

FIG. 14A illustrates another example embodiment of a program command set.

FIG. 14B illustrates an embodiment of a verify offset table.

DETAILED DESCRIPTION OF THE EMBODIMENTS

Figure 1:
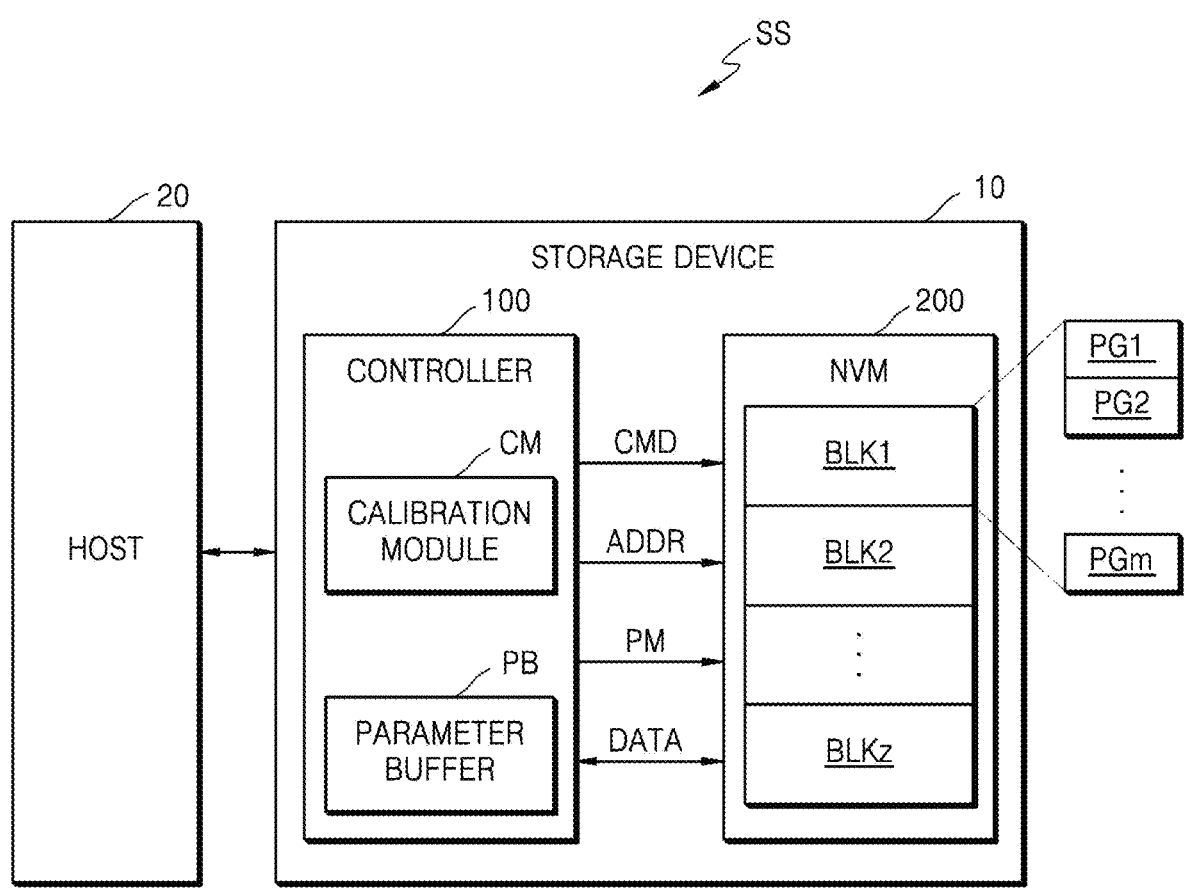
FIG. 1 is a block diagram illustrating an embodiment of a storage system.

FIG. 1 is a block diagram illustrating an embodiment of a storage system SS.

Referring to FIG. 1, the storage system SS may include a storage device 10 and a host 20, and storage device 10 may include a controller 100 and a non-volatile memory (NVM) 200. Host 20 may communicate with the storage device 10 through various interfaces and may transfer a read request and a program request to storage device 10. For example, host 20 may be implemented as an application processor (AP) or a system-on-a-chip (SoC).

NVM 200 may include a plurality of memory blocks BLK1 to BLKz. The plurality of memory blocks BLK1 to BLKz may each include a plurality of pages PG1 to PGm. Here, z and m may each be a positive integer and may be variously changed according to embodiments. For example, a memory block may be a unit of erasure (i.e., a unit of memory cells which are erased together in a single erase operation), and a page may be a unit of program and read (i.e., a unit of memory cells which are programmed together in a single program operation and read together in a single read operation). In some embodiments, NVM 200 may include a plurality of planes, a plurality of dies, or a plurality of chips. In an embodiment, NVM 200 may be a NAND flash memory device. However, the present embodiment is not limited thereto, and NVM 200 may be a resistive memory device such as resistive random access memory (ReRAM), phase change random access memory (PRAM), or magnetic random access memory (MRAM).

Controller 100 may control NVM 200 to read data DATA stored in NVM 200 in response to the read request from host 20, or to write the data DATA in NVM 200 in response to the program request from host 20. In the present embodiment, controller 100 may include a calibration module CM and a parameter buffer PB.

The calibration module CM may perform a read operation on NVM 200 to measure a plurality of threshold voltage distributions respectively corresponding to a plurality of memory units of NVM 200. Also, the calibration module CM may ascertain or measure a distribution variation between the plurality of memory units, based on the measured plurality of threshold voltage distributions and may dynamically ascertain or determine operation parameters for NVM 200, based on the measured distribution variation. In an embodiment, the plurality of memory units may correspond to a plurality of word lines, a plurality of memory blocks, a plurality of memory chips, or a plurality of packages. The parameter buffer PB may store the operation parameters dynamically ascertained or determined by the calibration module CM.

In an embodiment, the calibration module CM may dynamically ascertain or determine, by groups, the operation parameters for NVM 200. In an embodiment, the plurality of word lines may be grouped into a plurality of word line groups. In an embodiment, the plurality of memory blocks may be grouped into a plurality of memory block groups. In an embodiment, the plurality of chips may be grouped into a plurality of chip groups. The parameter buffer PB may store the operation parameters ascertained or determined by the calibration module CM so as to respectively match a plurality of groups.

Controller 100 may transmit a command set including a command CMD, an address ADDR, and an operation parameter PM to NVM 200 to control an operation of NVM 200. Controller 100 may select the operation parameter PM corresponding to the address ADDR from among the operation parameters stored in the parameter buffer PB and may transmit the selected operation parameter PM, the command CMD, and the address ADDR to NVM 200. In a program operation, controller 100 may transmit data to NVM 200, and in a read operation, NVM 200 may provide the data to controller 100. The command CMD, the address ADDR, the operation parameter PM, and the data DATA may be transmitted or received between controller 100 and NVM 200 through an input/output (I/O) bus.

The storage system SS may be implemented with, for example, a personal computer (PC), a data server, a network-attached storage (NAS), an Internet of things (IoT) device, or a portable electronic device. The portable electronic device may be, for example, a laptop computer, a mobile phone, a smartphone, a tablet PC, a personal digital assistant (PDA), an enterprise digital assistant (EDA), a digital still camera, a digital video camera, an audio device, a portable multimedia player (PMP), a portable navigation device (PND), an MP3 player, a handheld game console, an e-book, a wearable device, or the like. In some embodiments, storage device 10 may be an internal memory embedded into an electronic device. For example, storage device 10 may be a solid state drive (SSD), universal flash storage (UFS) memory device, embedded multi-media card (eMMC), or the like. In some embodiments, storage device 10 may be an external memory attachable/detachable on/from an electronic device. For example, storage device 10 may be a UFS memory card, compact flash (CF), secure digital (SD), micro-SD, mini-SD, extreme digital (xD), memory stick, or the like. In an embodiment, storage device 10 may comprise a key-value storage device or a key-value store, and for example, may be a key-value SSD. The key-value storage device may be a device which quickly and simply processes data by using a key-value pair. Here, the key-value pair may denote a pair consisting of a key having uniqueness and a value which is data corresponding to the key.

Figure 2:
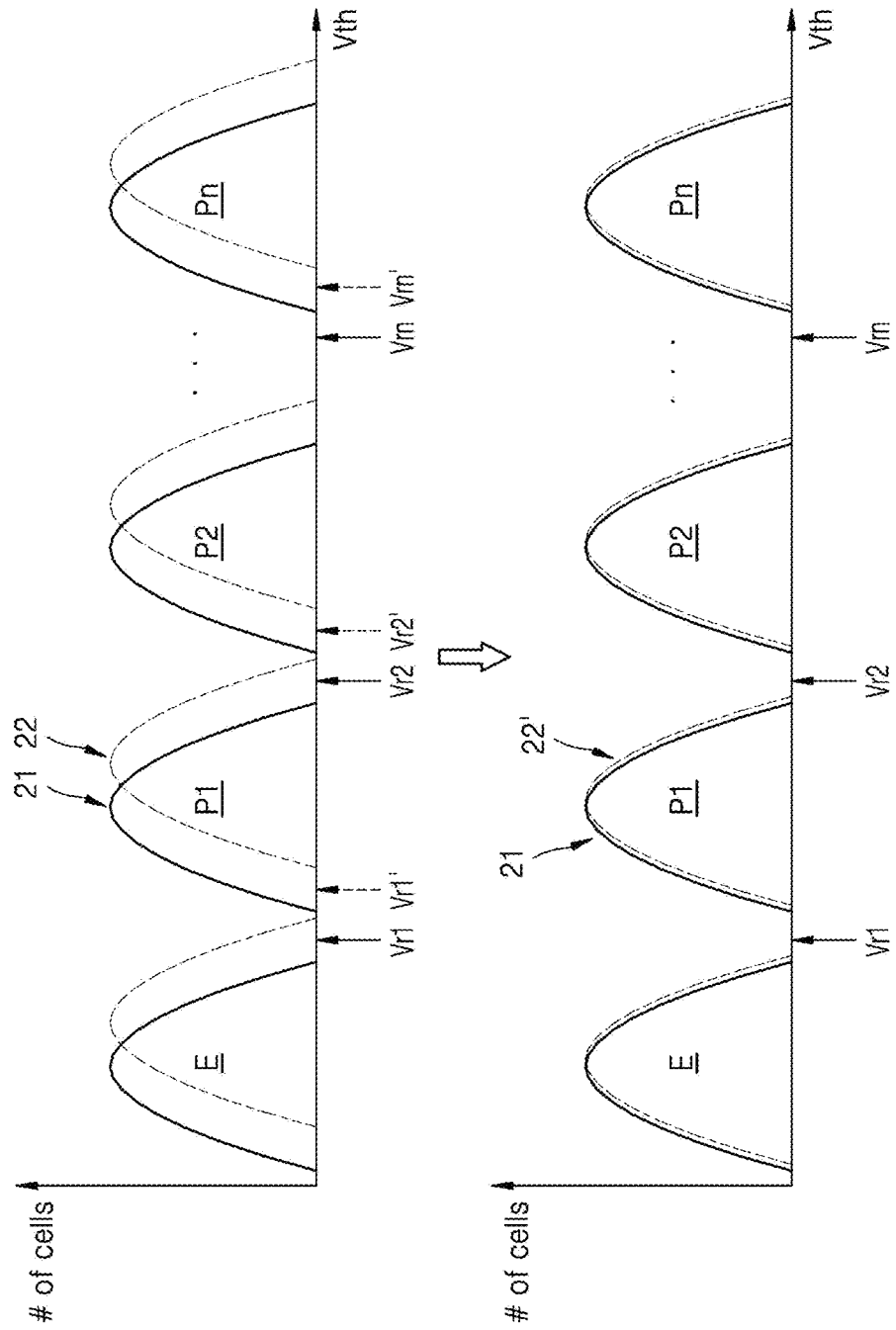
FIG. 2 is a graph showing a threshold voltage distribution of a non-volatile memory of FIG. 1.

FIG. 2 is a graph showing a threshold voltage distribution of NVM 200 of FIG. 1. Referring to FIGS. 1 and 2, first memory cells included in a first memory unit of NVM 200 may have a first threshold voltage distribution 21, and second memory cells included in a second memory unit of NVM 200 may have a second threshold voltage distribution 22. The first and second memory cells may be programmed to one of first to nth program states P1 to Pn. Otherwise, the first and second memory cells may be erased to an erase state E. Herein, n may be a positive integer and may be variously changed according to embodiments. For example, in a multi-level cell (MLC), n may be 3, and in a triple level cell (TLC), n may be 7. Also, in a quadruple level cell (QLC), n may be 15.

First and second threshold voltage distributions 21 and 22 may differ from each other, and a difference between first and second threshold voltage distributions 21 and 22 may be referred to as a distribution variation. In an embodiment, the distribution variation may occur before releasing storage device 10, that is, before selling storage device 10, and for example, may occur due to a physical location difference between the first and second memory units. In an embodiment, the distribution variation may occur while storage device 10 is operating after storage device 10 is released, and for example, may occur due to a program/erase cycle, a retention time, program disturbance, and read disturbance of each of the first and second memory units.

Due to the distribution variation, in a case of reading data from the second memory cells included in the second memory unit of NVM 200 by using read voltages Vr1, Vr2, and Vrn, a read error can occur. Therefore, controller 100 should ascertain or determine the read voltages Vr1, Vr2, and Vrn for the first memory cells and read voltages Vr1', Vr2', and Vrn' for the second memory cells and store and manage the ascertained or determined read voltages Vr1, Vr2, and Vrn and read voltages Vr1', Vr2', and Vrn', For this reason, overhead may be very large in some storage devices. Particularly, once a plurality of read requests are generated for programmed memory cells, read voltages should be calibrated every time, and the calibrated read voltages should be managed, causing a large increase in overhead.

According to the present embodiment, the calibration module CM may measure a distribution variation between the first memory cells included in the first memory unit of NVM 200 and the second memory cells included in the second memory unit of NVM 200, and may dynamically ascertain or determine operation parameters, based on the measured distribution variation. Therefore, the calibration module CM may calibrate the distribution variation before releasing storage device 10, or may calibrate the distribution variation while storage device 10 is operating after storage device 10 is released. Therefore, the calibration module CM flexibly copes with stress which occurs when storage device 10 is being assembled or is operating, thereby enhancing the performance and reliability of storage device 10.

In an embodiment, the calibration module CM may ascertain or determine first operation parameters for the first memory unit and second operation parameters for the second memory unit which are different from the first operation parameters, and may store the ascertained or determined first and second operation parameters in the parameter buffer PB. Subsequently, NVM 200 may perform a program/erase operation on the second memory cells by using the second operation parameters, and thus, a threshold voltage distribution of the second memory cells may be changed from second threshold voltage distribution 22 to a corrected second threshold voltage distribution 22'. Therefore, a distribution variation between second threshold voltage distribution 22 and corrected second threshold voltage distribution 22' is reduced, and data may be read from the first and second memory cells by using the same read voltages Vr1, Vr2, and Vrn, thereby decreasing overhead of storage device 10.

Figure 3:
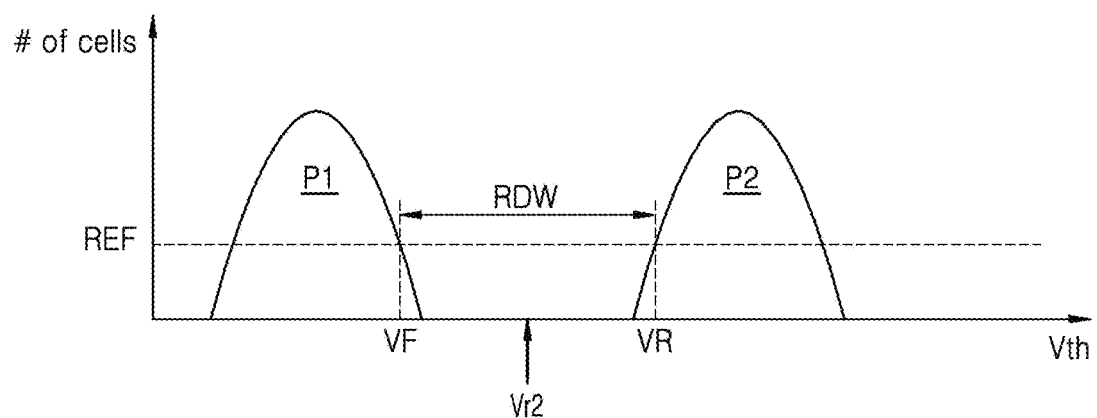
FIG. 3 is a graph showing enlarged first and second program states of FIG. 2.

FIG. 3 is a graph showing enlarged first and second program states P1 and P2 of FIG. 2. Referring to FIG. 3, a read window RDW between the first and second program states P1 and P2 may be defined as a difference between a fall voltage VF corresponding to the first program state P1 and a rise voltage VR corresponding to the second program state P2. Here, the fall voltage VF may represent a threshold voltage where the number of "off" cells corresponds to a reference number REF, based on an "off" cell count result for memory cells programmed to the first program state P1. The rise voltage VR may represent a threshold voltage where the number of "off" cells corresponds to the reference number REF, based on an "off" cell count result for memory cells programmed to the second program state P2. A read voltage Vr2 for determining the second program state P2 should have a voltage level within the read window RWD, and in order to decrease a read error, the read window RWD should be sufficiently widely secured.

Figure 4:
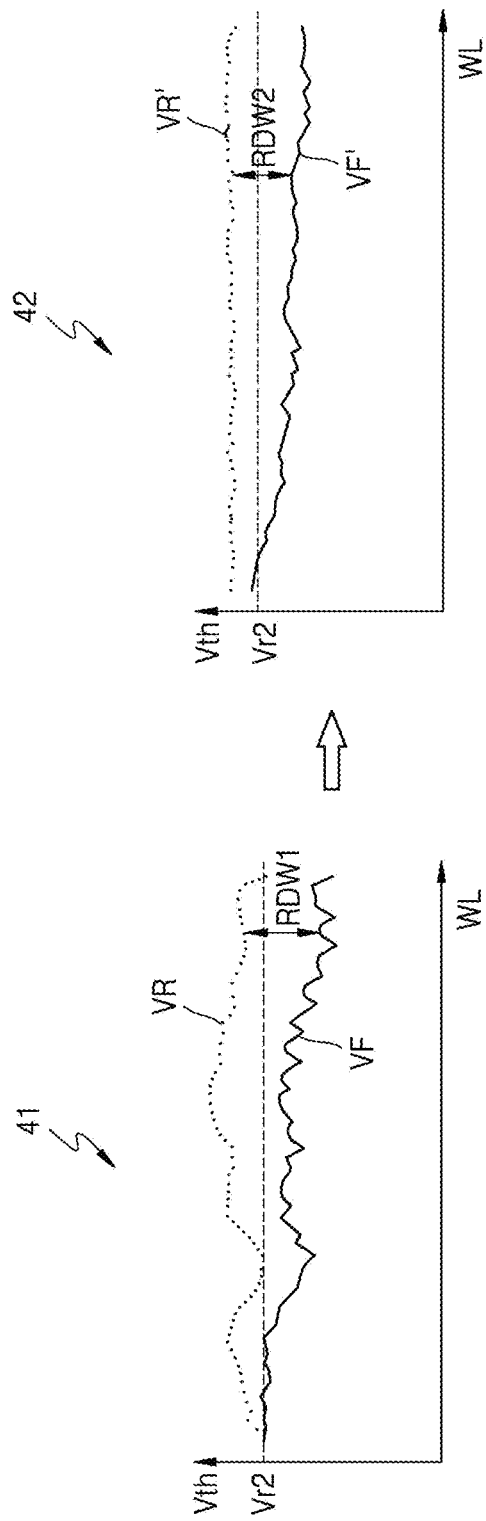
FIG. 4 shows graphs showing variations of a rising voltage and a falling voltage with respect to word lines, according to an embodiment.

FIG. 4 is a graph showing an embodiment of variations of a rise voltage VR and a fall voltage VF with respect to word lines WL. Referring to FIG. 4, a first graph 41 represents a rise voltage VR and a fall voltage VF with respect to word lines WL, and for example, may correspond to the rise voltage VR and the fall voltage VF of FIG. 3. In the first graph 41, a first read window RDW1, which is a difference between the rise voltage VR and the fall voltage VF, has a very large variation among the word lines WL. A second graph 42 represents a rise voltage VR' and a fall voltage VF' with respect to word lines WL in a case where memory cells are programmed by using operation parameters which are dynamically determined according to an embodiment. In the second graph 42, a second read window RDW2 which is a difference between the rise voltage VR' and the fall voltage VF' has a variation among the word lines WL which is reduced in comparison with the variation of the first read window RDW1. Therefore, even in a case of reading memory cells programmed to the second program state P2 by using a read voltage Vr2, the reliability of the storage device is ensured.

Figure 5:
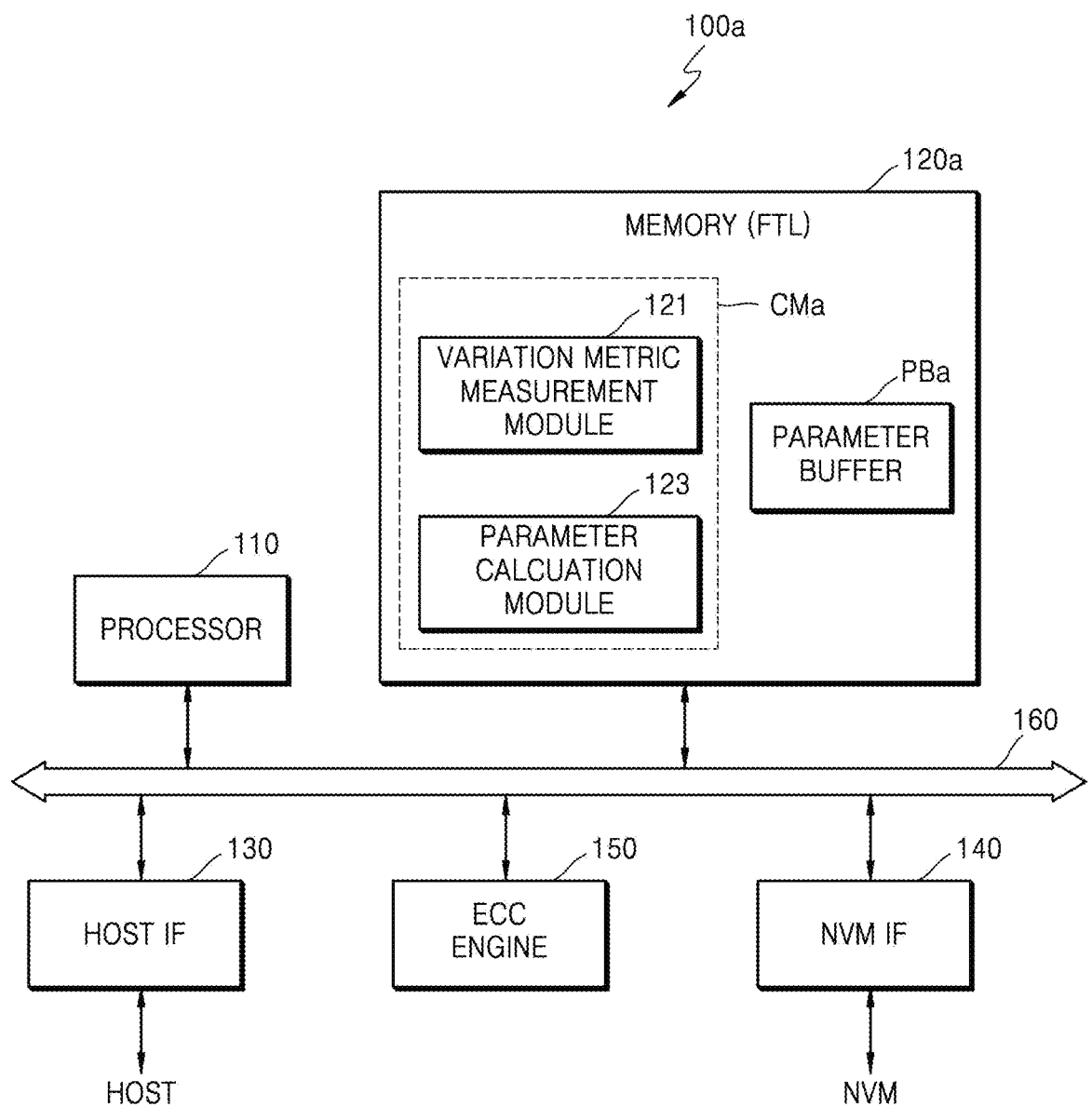
FIG. 5 is a block diagram illustrating an example embodiment of a controller of FIG. 1.

FIG. 5 is a block diagram illustrating an example embodiment of the controller of FIG. 1.

Referring to FIGS. 1 and 5, a controller 100a may include a processor 110, a memory 120a, a host interface 130, an NVM interface 140, and an error correcting code (ECC) engine 150, and the elements may communicate with one another through a bus 160. Processor 110 may include a central processing unit (CPU) or a microprocessor and may control an overall operation of controller 100a. Memory 120a may operate under control of processor 110 and may be used as a working memory, a buffer memory, a cache memory, or the like. For example, memory 120a may be implemented as a volatile memory such as dynamic random access memory (DRAM) or static random access memory (SRAM) or NVM such as PRAM or flash memory.

A calibration module CMa may be implemented as firmware or software and may be loaded into memory 120a. In an embodiment, the calibration module CMa may be implemented in a flash translation layer (FTL) and may be loaded into memory 120a. However, the present embodiment is not limited thereto, and the calibration module CMa may be implemented as hardware. In an embodiment, the calibration module CMa may include a variation metric measurement module 121 and a parameter calculation module 123.

Variation metric measurement module 121 may measure a distribution variation metric from a plurality of threshold voltage distributions. In an embodiment, the distribution variation metric may correspond to a first threshold voltage level, at which the number of "on" cells of programmed memory cells in each of memory units of NVM 200 corresponds to a first number, or a second threshold voltage level at which the number of "off" cells of the programmed memory cells in each of the memory units of NVM 200 corresponds to a second number. In an embodiment, the distribution variation metric may correspond to the number of "on" cells of memory cells, which are programmed by using a first word line voltage level in each memory unit of NVM 200, or the number of "off" cells of the memory cells which are programmed by using the first word line voltage level in each memory unit of NVM 200. In an embodiment, the distribution variation metric may correspond to a read voltage level for minimizing an error bit in each memory unit of NVM 200. Parameter calculation module 123 may calculate the operation parameters for NVM 200, based on the distribution variation metric.

The parameter buffer PBa may store the operation parameters calculated by parameter calculation module 123 and may be implemented as a portion of memory 120a. In an embodiment, the calibration module CMa and the parameter buffer PBa may be implemented as one chip. However, the present embodiment is not limited thereto, and the calibration module CMa and the parameter buffer PBa may be implemented as different chips. Also, a mapping table for changing a logical address, received from host 20, to a physical address of NVM 200 may be loaded into memory 120a.

Host interface 130 may provide an interface between host 20 and controller 100a, and for example, may provide an interface based on universal serial bus (USB), MMC, PCI express (PIC-E), advanced technology attachment (ATA), serial-ATA (SATA), parallel-ATA (PATA), small computer system interface (SCSI), serial attached SCSI (SAS), enhanced small disk interface (ESDI), integrated drive electronics (IDE), or the like. NVM interface 140 may provide an interface between controller 100a and NVM 200. For example, a command, an address, an operation parameter, program data, and read data may be transmitted or received between controller 100a and NVM 200 through NVM interface 140. ECC engine 150 may perform an ECC operation on data received from NVM 200 to detect one or more bit errors in the data and may correct the detected error bit(s). In an embodiment, ECC engine 150 may be implemented as hardware. In an embodiment, ECC engine 150 may be implemented as firmware or software and may be loaded into memory 120a.

Figure 6:
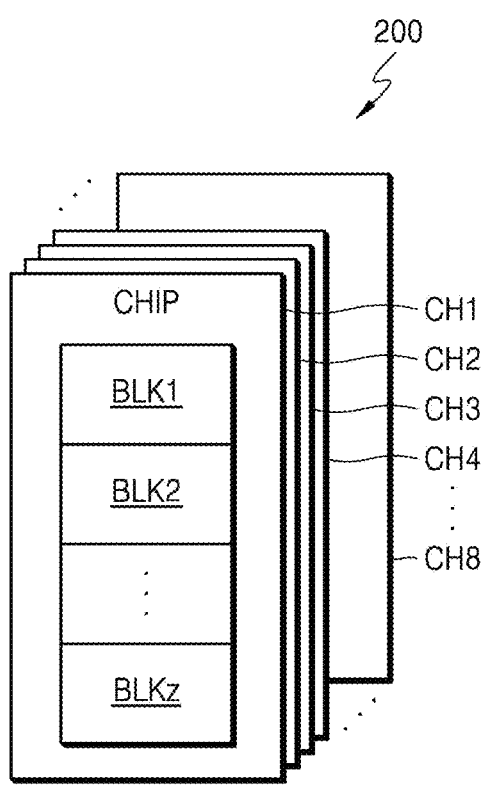
FIG. 6 is a block diagram illustrating an example embodiment of a non-volatile memory of FIG. 1.

FIG. 6 is a block diagram illustrating an example embodiment of NVM 200 of FIG. 1. Referring to FIGS. 1 and 6, NVM 200 may include first to eighth memory chips CH1 to CH8, and each of the first to eighth memory chips CH1 to CH8 may include a plurality of memory blocks BLK1 to BLKz. In FIG. 6, NVM 200 is illustrated as including the first to eighth memory chips CH1 to CH8, but this is merely an example. The number of memory chips included in NVM 200 may be variously changed according to embodiments.

In an embodiment, a memory unit may be a memory chip, and controller 100 may measure threshold voltage distributions of the first to eighth memory chips CH1 to CH8, measure a distribution variation between the first to eighth memory chips CH1 to CH8, and dynamically ascertain or determine operation parameters for the first to eighth memory chips CH1 to CH8, based on the measured distribution variation. For example, first operation parameters for the first memory chip CH1 may differ from second operation parameters for the second memory chip CH2.

In an embodiment, the memory unit may be a memory block, and controller 100 may measure threshold voltage distributions of the plurality of memory blocks BLK1 to BLKz, measure a distribution variation between the plurality of memory blocks BLK1 to BLKz, and dynamically ascertain or determine operation parameters for the plurality of memory blocks BLK1 to BLKz, based on the measured distribution variation. For example, first operation parameters for a first memory block BLK1 may differ from second operation parameters for a second memory block BLK2.

Figure 7:
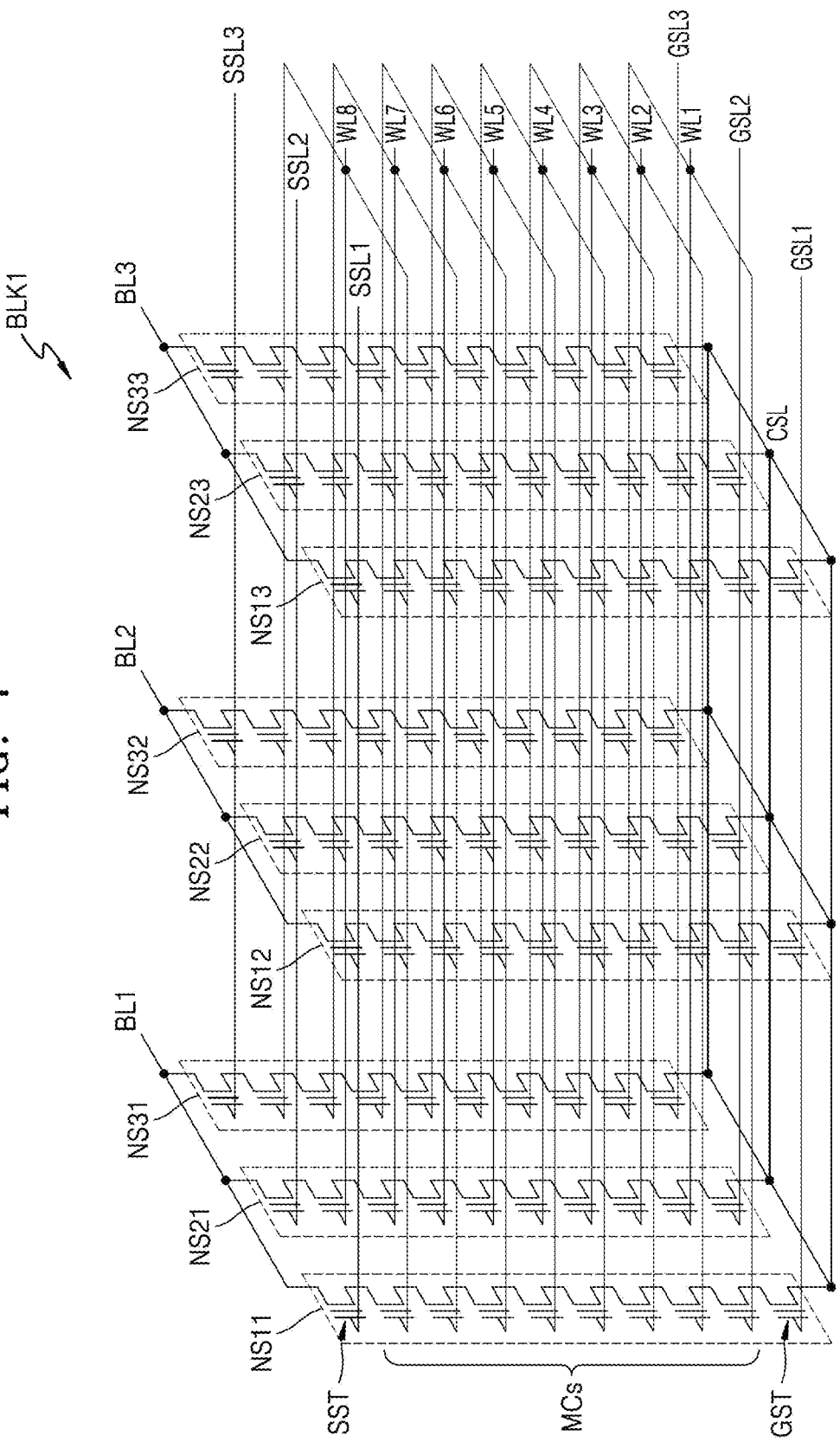
FIG. 7 is a circuit diagram exemplarily illustrating an example embodiment of a first memory block of FIG. 1.

FIG. 7 is a circuit diagram exemplarily illustrating an example of a first memory block BLK1 of FIG. 1 according to an embodiment. Referring to FIGS. 1 and 7, the first memory block BLK1 may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. NAND strings NS11 to NS33 each comprise a plurality of memory cells (MC). The other memory blocks BLK2 to BLKz of FIG. 1 may be substantially implemented identically to the first memory block BLK1.

In an embodiment, a memory unit may comprise a word line and the memory cells (MC) which are connected to that word line, and controller 100 may measure threshold voltage distributions of the memory cells connected to the plurality of word lines WL1 to WL8, measure a distribution variation between the memory cells connected to the plurality of word lines WL1 to WL8, and dynamically determine operation parameters for the plurality of word lines WL1 to WL8, based on the measured distribution variation. For example, first operation parameters for a first word line WL1 may differ from second operation parameters for a second word line WL2.

Figure 8A:
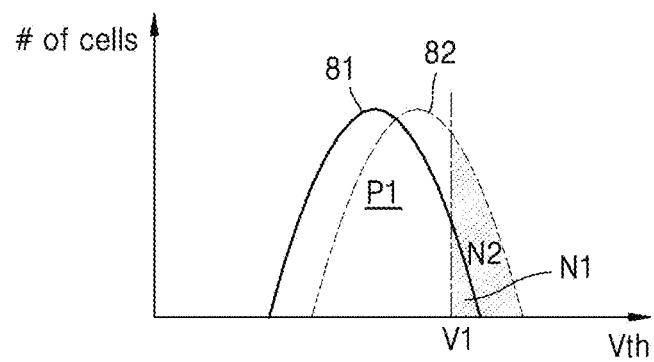
FIGS. 8A and 8B exemplarily illustrate distribution variation metrics between threshold voltage distributions, according to an embodiment.
Figure 8B:
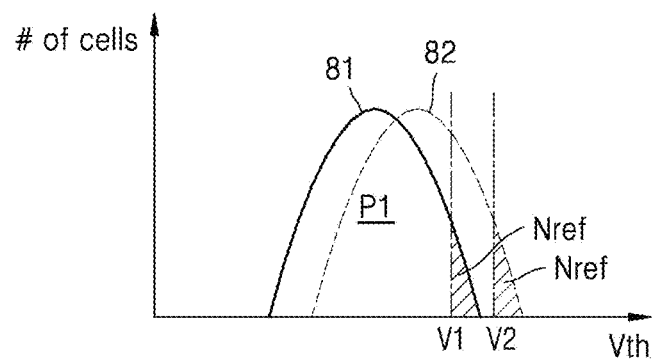

FIGS. 8A and 8B show example embodiments of distribution variation metrics between threshold voltage distributions. Referring to FIGS. 8A and 8B, a first threshold voltage distribution 81 may correspond to a threshold voltage distribution of memory cells included in a first memory unit, and a second threshold voltage distribution 82 may correspond to a threshold voltage distribution of memory cells included in a second memory unit.

Referring to FIG. 8A, in an embodiment, a distribution variation metric may correspond to the number of "off" cells, based on an "off" cell counting result using a first voltage V1. For example, in a case where the first voltage V1 is applied to a word line connected to memory cells having the first threshold voltage distribution 81, the number of "off" cells may be a first number N1, and in a case where the first voltage V1 is applied to a word line connected to memory cells having the second threshold voltage distribution 82, the number of "off" cells may be a second number N2. In this case, the first number N1 and the second number N2 may be an example of a distribution variation metric, and a difference between the first number N1 and the second number N2 may correspond to distribution variations of the first and second threshold voltage distributions 81 and 82.

Referring to FIG. 8B, in an embodiment, a distribution variation metric may correspond to a threshold voltage level at which the number of "off" cells corresponds to a reference number Nref. For example, in a read result for the memory cells having the first threshold voltage distribution 81, a threshold voltage level at which the number of "off" cells corresponds to the reference number Nref may be the first voltage V1, and in a read result for the memory cells having the second threshold voltage distribution 82, a threshold voltage level at which the number of "off" cells corresponds to the reference number Nref may be the second voltage V2. In this case, the first voltage V1 and the second voltage V1 may be an example of a distribution variation metric, and a difference between the first voltage V1 and the second voltage V2 correspond to distribution variations of the first and second threshold voltage distributions 81 and 82.

FIGS. 9A to 9D are graphs showing some embodiments of methods of calibrating a threshold voltage distribution.

Figure 9A:
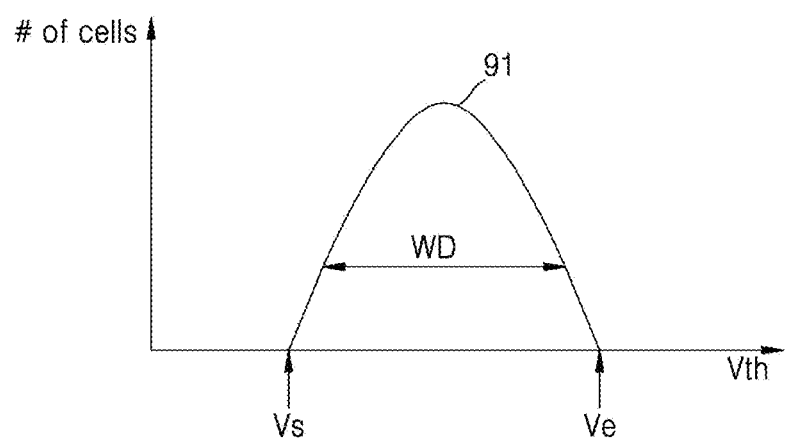
FIGS. 9A, 9B, 9C and 9D are graphs showing methods of calibrating a threshold voltage distribution, according to some embodiments.

Referring to FIG. 9A, in an embodiment, a first threshold voltage distribution 91 may have a program state corresponding to one of first to nth program states P1 to Pn of FIG. 2. A shape and a location of the first threshold voltage distribution 91 may be ascertained or determined based on a start voltage Vs which is a start location of the program state, an end voltage Ve which is an end location of the program state, and a distribution width WD. For example, the start voltage Vs may be determined based on a program verify voltage, the end voltage Ve may be determined based on a program start voltage, and the distribution width WD may be ascertained or determined based on an incremental step pulse program (ISPP) program loop count. Therefore, the shape and location of the first threshold voltage distribution 91 may be changed by changing the program verify voltage, the program start voltage, and/or the ISPP program loop count.

In an embodiment, first threshold voltage distribution 91 may correspond to an erase state E of FIG. 2. The shape and location of first threshold voltage distribution 91 may be determined based on a start voltage Vs which is a start location of the erase state E, an end voltage Ve which is an end location of the erase state E, and the distribution width WD. For example, the start voltage Vs may be determined based on an erase start voltage, the end voltage Ve may be determined based on an erase verify voltage, and the distribution width WD may be ascertained or determined based on the ISPP program loop count. Therefore, the shape and location of first threshold voltage distribution 91 may be changed by changing the erase verify voltage, the erase start voltage, and/or the ISPP program loop count.

Figure 9B:
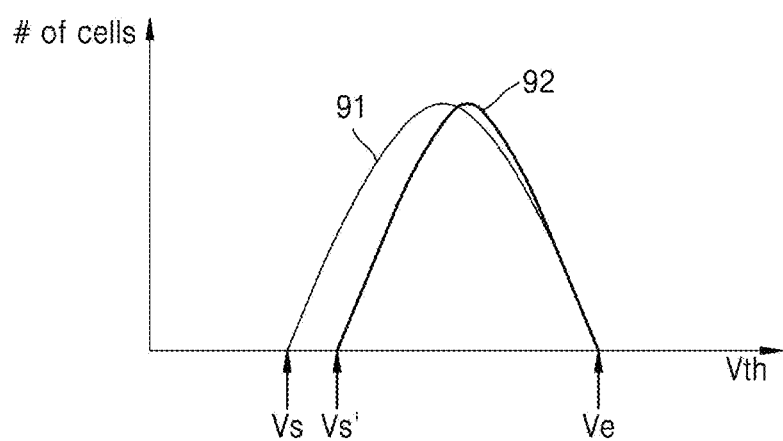

Referring to FIG. 9B, in an embodiment, when first threshold voltage distribution 91 is one of the first to nth program states P1 to Pn, a second threshold voltage distribution 92 may be obtained by increasing a program verify voltage for memory cells having first threshold voltage distribution 91. In an embodiment, when first threshold voltage distribution 91 is in the erase state E, second threshold voltage distribution 92 may be obtained by decreasing an erase start voltage for the memory cells having first threshold voltage distribution 91. A start voltage Vs' of second threshold voltage distribution 92 may be shifted in a positive direction compared to start voltage Vs of first threshold voltage distribution 91.

Figure 9C:
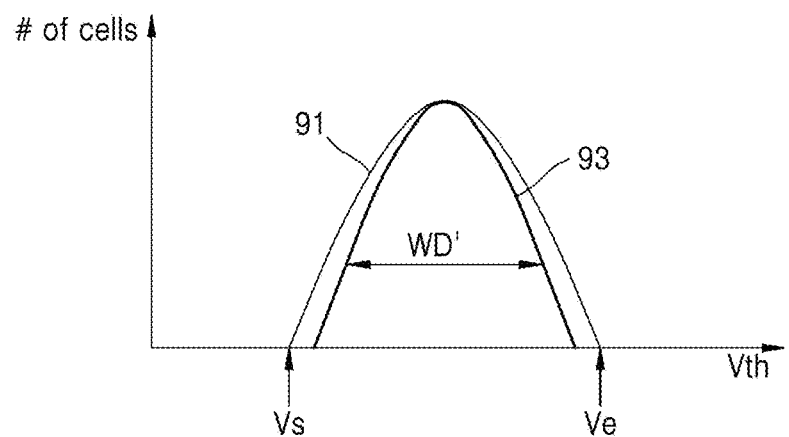

Referring to FIG. 9C, in an embodiment, when first threshold voltage distribution 91 is one of the first to nth program states P1 to Pn, a third threshold voltage distribution 93 may be obtained by increasing an ISPP program loop count for the memory cells having first threshold voltage distribution 91. In an embodiment, when first threshold voltage distribution 91 is in the erase state E, third threshold voltage distribution 93 may be obtained by increasing the ISPP program loop count for the memory cells having first threshold voltage distribution 91. A distribution width WD' of third threshold voltage distribution 93 may be narrower than the distribution width WD of first threshold voltage distribution 91.

Figure 9D:
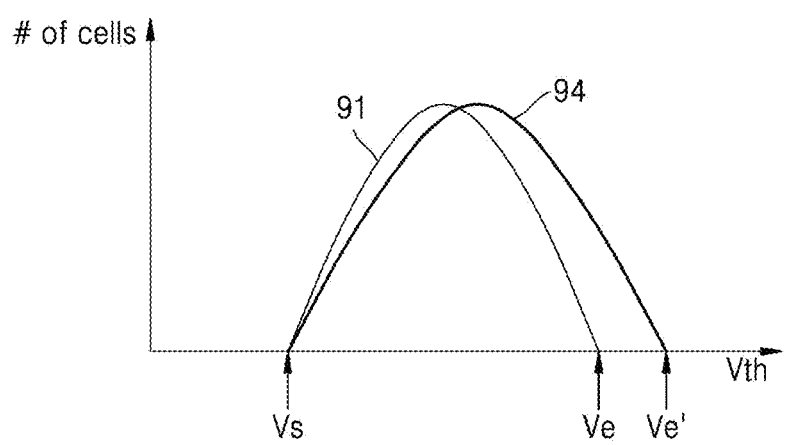

Referring to FIG. 9D, in an embodiment, when first threshold voltage distribution 91 is one of the first to nth program states P1 to Pn, a fourth threshold voltage distribution 94 may be obtained by increasing a program start voltage for memory cells having first threshold voltage distribution 91. In an embodiment, when first threshold voltage distribution 91 is in the erase state E, fourth threshold voltage distribution 94 may be obtained by increasing an erase verify voltage for the memory cells having first threshold voltage distribution 91. An end voltage Ve' of fourth threshold voltage distribution 94 may be shifted in a positive direction compared to end voltage Ve of first threshold voltage distribution 91.

FIGS. 10A to 10D are graphs showing some embodiments of threshold voltage distribution calibration results. Hereinafter, the threshold voltage distribution calibration results will be described with reference to FIGS. 1 and 10A to 10D.

Referring to FIG. 10A, a threshold voltage distribution represents a threshold voltage distribution of memory cells included in first to third memory units, and for example, the memory cells may be programmed to one of the first to third program states P1 to P3. The first program state P1 shows a first distribution 101, having a widest distribution width, of first distributions respectively corresponding to the first to third memory units. The third program state P3 shows a third distribution 105, having a widest distribution width, of third distributions respectively corresponding to the first to third memory units. The second program state P2 shows second distributions 102a, 103a, and 104a respectively corresponding to the first to third memory units. A first read window A1 may correspond to a difference between a fall voltage VF1 of first distribution 101 and a rise voltage VR2a of second distribution 102a, having a lowest rise voltage, of second distributions 102a, 103a, and 104a. Also, a second read window B1 may correspond to a difference between a rise voltage VR3 of third distribution 105 and a fall voltage VF2a of second distribution 104a, having a highest fall voltage, of second distributions 102a, 103a, and 104a.

Figure 10B:
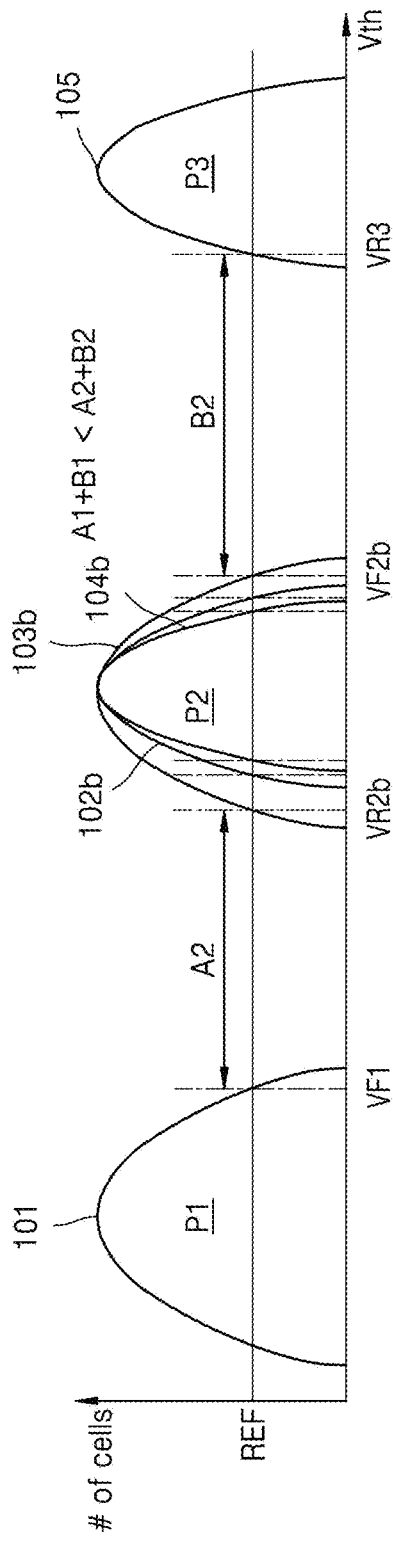

Referring to FIG. 10B, the calibration module CM may calibrate operation parameters to align second distributions 102b, 103b, and 104b with respect to a center. For example, the calibration module CM may increase an ISPP program loop count for the memory cells included in the first and third memory cells to decrease a distribution width of each of second distributions 102b and 104b and may align centers of second distributions 102b, 103b, and 104b. Therefore, a rise voltage VR2b of second distribution 103b, having a widest distribution width, of second distributions 102b, 103b, and 104b may become higher than the rise voltage VR2a of FIG. 10A, and a fall voltage VF2b may become lower than the fall voltage VF2a of FIG. 10A. Accordingly, first and second read windows A2 and B2 may further increase compared to first and second read windows A1 and B1 of FIG. 10A, respectively.

Figure 10C:
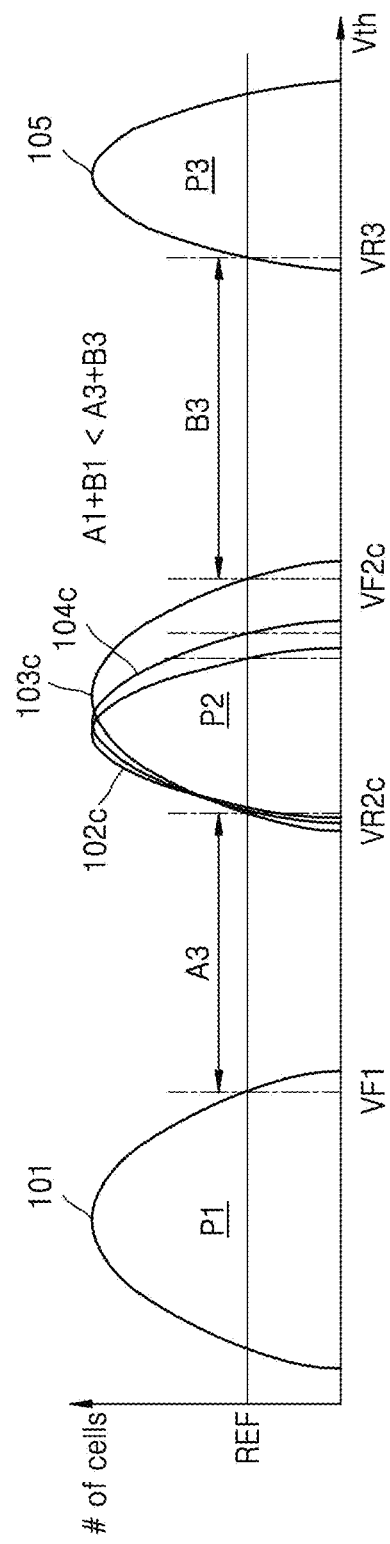

Referring to FIG. 10C, the calibration module CM may calibrate operation parameters to align second distributions 102c, 103c, and 104c to the left. For example, the calibration module CM may adjust program verify voltages for the memory cells included in the first and third memory cells, thereby substantially making rise voltages VR2c of second distributions 102c, 103c, and 104c similar. Therefore, a rise voltage VR2c of second distribution 103c, having a widest distribution width, of second distributions 102c, 103c, and 104c may become higher than the rise voltage VR2a of FIG. 10A, and a fall voltage VF2c may become lower than the fall voltage VF2a of FIG. 10A. Accordingly, first and second read windows A3 and B3 may further increase compared to first and second read windows A1 and B1 of FIG. 10A, respectively.

Figure 10D:
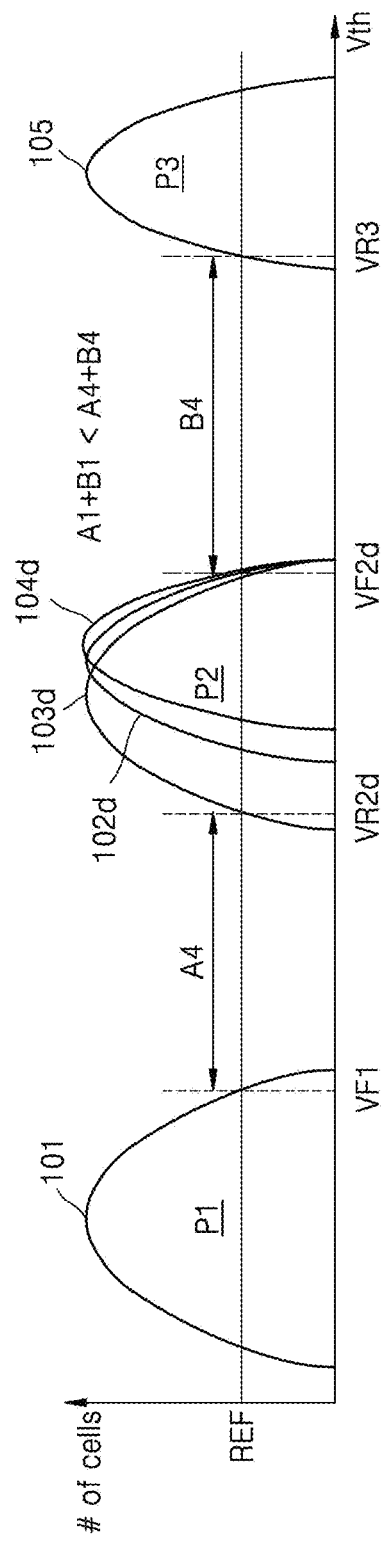

Referring to FIG. 10D, the calibration module CM may calibrate operation parameters to align second distributions 102d, 103d, and 104d to the right. For example, the calibration module CM may adjust program start voltages for the memory cells included in the first and third memory cells, thereby substantially making fall voltages VF2d of second distributions 102d, 103d, and 104d similar. Therefore, a rise voltage VR2d of second distribution 103d, having a widest distribution width, of second distributions 102d, 103d, and 104d may become higher than the rise voltage VR2a of FIG. 10A, and a fall voltage VF2d may become lower than the fall voltage VF2a of FIG. 10A. Accordingly, first and second read windows A4 and B4 may further increase compared to first and second read windows A1 and B1 of FIG. 10A, respectively.

Figure 11:
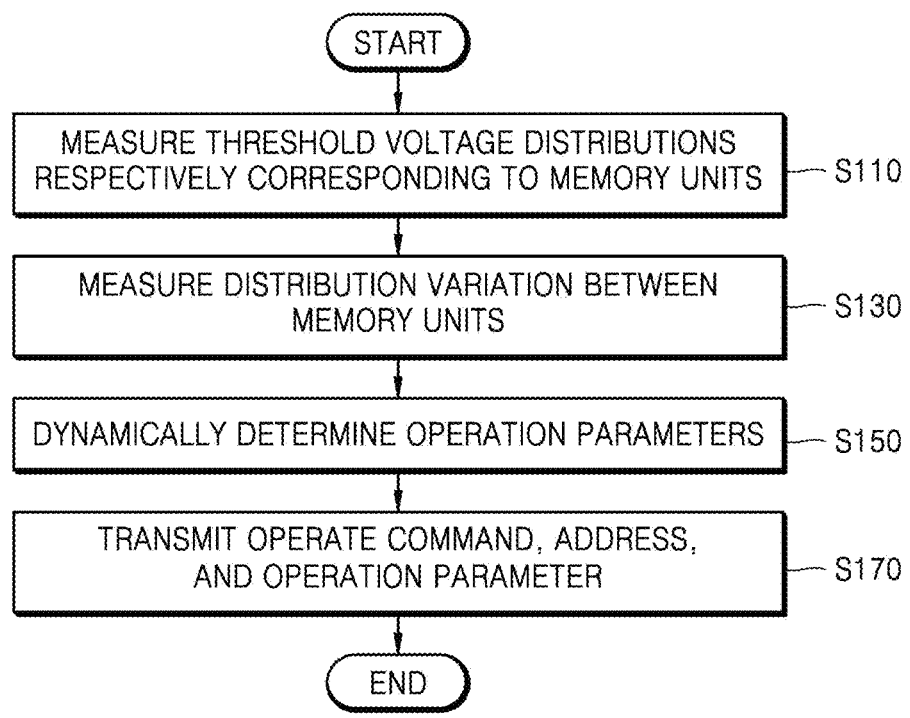
FIG. 11 is a flowchart illustrating an embodiment of an operating method of a storage device.

FIG. 11 is a flowchart illustrating an embodiment of an operating method of a storage device. Referring to FIG. 11, the operating method according to the present embodiment may correspond to a method of calibrating operation parameters corresponding to word lines so as to decrease a distribution variation between a plurality of memory units, for example, the memory cells connected to the word lines. For example, the operating method according to the present embodiment may include processes which are time-serially performed by the storage device 10 of FIG. 1. Details described above with reference to FIGS. 1 to 10D may be applied to the present embodiment, and overlapping descriptions are omitted.

In some embodiments, the operating method may further include a process of receiving, by a controller, read data from an NVM before operation S110. Therefore, operations S110 to operations S170 may be performed by the controller, based on the read data received from the NVM.

In operation S110, a plurality of threshold voltage distributions respectively corresponding to a plurality of memory units may be measured. For example, controller 100 may transmit a first read command and a first address corresponding to a first memory unit to NVM 200, and in response to the first read command, NVM 200 may perform a read operation on memory cells corresponding to the first address to measure a first threshold voltage distribution corresponding to a first memory unit. Subsequently, controller 100 may transmit a second read command and a second address corresponding to a second memory unit to NVM 200, and in response to the second read command, NVM 200 may perform a read operation on memory cells corresponding to the second address to measure a second threshold voltage distribution corresponding to a second memory unit.

In operation S130, a distribution variation between the plurality of memory units may be measured. For example, a distribution variation may be obtained by measuring a difference between the first threshold voltage distribution corresponding to the first memory unit and the second threshold voltage distribution corresponding to the second memory unit. In an embodiment, a distribution variation metric representing the distribution variation may correspond to a first threshold voltage level, where the number of "on" cells of programmed memory cells in each of the memory units corresponds to a first number, or a second threshold voltage level at which the number of "off" cells of the programmed memory cells in each of the memory units corresponds to a second number. In an embodiment, the distribution variation metric may include the number of "on" cells of memory cells, which are programmed by using a first word line voltage level in each memory unit of NVM 200, or the number of "off" cells of the memory cells which are programmed by using the first word line voltage level in each memory unit. In an embodiment, the distribution variation metric may correspond to a read voltage level for minimizing bit errors in each memory unit of NVM 200.

In operation S150, operation parameters may be dynamically ascertained or determined. For example, the calibration module CM included in controller 100 may dynamically ascertain or determine first operation parameters for memory cells included in the first memory unit and may dynamically ascertain or determine second operation parameters for memory cells included in the second memory unit. In an embodiment, the first and second operation parameters may be stored in the parameter buffer PB included in controller 100. For example, the parameter buffer PB may be implemented with SRAM. In an enbedment, the first and second operation parameters may be stored in a volatile memory (for example, DRAM) outside controller 100. In an embodiment, the first and second operation parameters may be stored in NVM 200.

In operation S170, an operate command, an address, and an operation parameter may be transmitted. In an embodiment, controller 100 may generate a program command set including a program command, a program address, a program operation parameter, and program data, and may transmit the generated program command set to NVM 200. This will be described below with reference to FIGS. 12 and 14B. In an embodiment, controller 100 may generate an erase command set including an erase command, an erase address, and an erase operation parameter and may transmit the generated erase command set to NVM 200. This will be described below with reference to FIGS. 15 and 16. In an embodiment, controller 100 may generate a read command set including a read command, a read address, and a read operation parameter and may transmit the generated read command set to NVM 200. This will be described below with reference to FIGS. 17 and 18.

Figure 12:
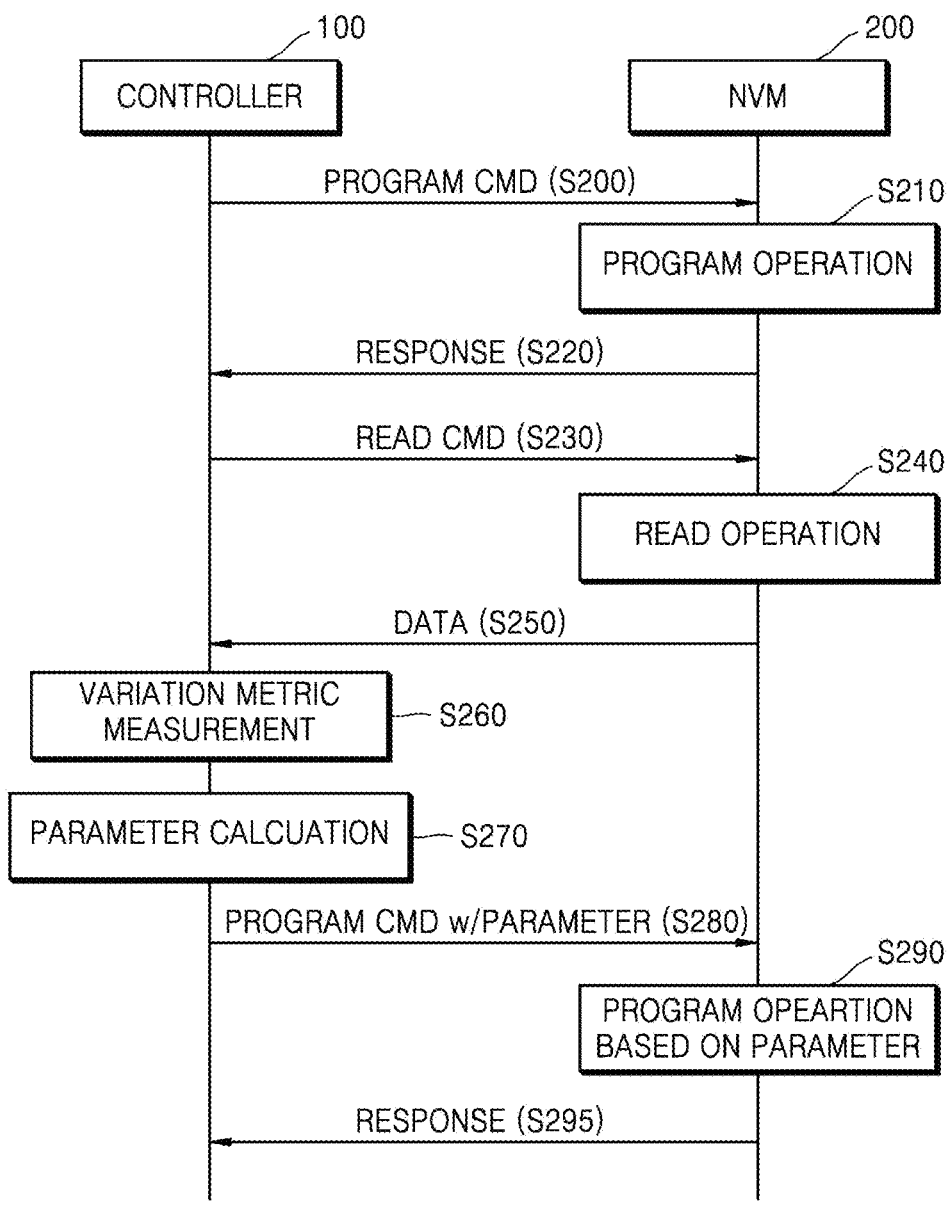
FIG. 12 is a flowchart illustrating an embodiment of a program operation between a controller and a non-volatile memory.

FIG. 12 is a flowchart illustrating an embodiment of a program operation between controller 100 and NVM 200.

Referring to FIG. 12, in operation S200, controller 100 may transmit a program command to NVM 200. Controller 100 may further transmit a program address and program data to NVM 200. In operation S210, NVM 200 may perform a program operation in response to the program command In operation S220, NVM 200 may transmit to controller 100 a response message representing a program end.

In operation S230, controller 100 may transmit a read command to NVM 200. In an embodiment, controller 100 may transmit a read command and a first address corresponding to a first memory unit, and then, may transmit the read command and a second address corresponding to a second memory unit. In operation S240, NVM 200 may perform a read operation in response to the read command In an embodiment, for example, NVM 200 may sequentially apply a read voltage to a word line at intervals of 0.1V to generate a threshold voltage distribution. In an embodiment, NVM 200 may perform a read operation on memory cells corresponding to the first address, and then, may perform a read operation on memory cells corresponding to the second address. In operation S250, NVM 200 may transmit read data to controller 100.

In operation S260, controller 100 may measure a distribution variation metric of threshold voltage distributions between a plurality of memory units. In operation S270, controller 100 may calculate operation parameters (for example, program operation parameters), based on the measured distribution variation metric. In operation S280, controller 100 may transmit a program command and one or more program operation parameters to NVM 200. In operation S290, NVM 200 may perform a program operation, based on the transmitted program operation parameter(s). In operation S295, NVM 200 may transmit a response message representing a program end to controller 100.

FIG. 13 illustrates an example embodiment of a program command set 131. Referring to FIGS. 1 and 13, a program command set 131 may be transmitted through an I/O bus IOx between controller 100 and NVM 200. Program command set 131 may include a first command CMD1, an address ADDR, an operation parameter PM, data DATA, and a second command CMD2. Therefore, NVM 200 may sequentially receive the first command CMD1, the address ADDR, the operation parameter PM, the data DATA, and the second command CMD2.

The first command CMD1 may be a program sequence start command, for example, 80 h. The second command CMD2 may be a program sequence end command, for example, 10 h. The address ADDR may include, for example, column addresses having two clock cycles and row addresses having three clock cycles. The operation parameter PM may include a program start voltage $V_{PGM}$, a loop count, and a program verify voltage $V_{VFY}$. However, the present embodiment is not limited thereto, and in some embodiments, a transmission sequence of the operation parameter PM and the data DATA may be changed. When the second command CMD2 is received, a ready/busy signal RnBx of NVM 200 may be shifted from a high level to a low level, and thus, an operation of programming the data DATA in memory cells having the received address ADDR may be performed during a program time tPRGM.

FIG. 14A illustrates another example embodiment of a program command set 141, and FIG. 14B illustrates an embodiment of a verify offset table 142. Hereinafter, a program command set 141 and verify offset table 142 will be described with reference to FIGS. 1, 14A, and 14B.

Program command set 141 may be transmitted through an I/O bus IOx between controller 100 and NVM 200. Program command set 141 may correspond to a modified example of program command set 131 of FIG. 13. Hereinafter, a difference between program command set 141 according to the present embodiment and the program command set 131 of FIG. 13 will be mainly described.

The operation parameter PM may include first to nth verify offsets VP1 to VPn. Here, each of the verify offsets VP1 to VPn may represent an offset for a reference program verify voltage. The parameter buffer PB may store verify offset table 142. For example, verify offset table 142 may include a verify offset set corresponding to each of a plurality of word lines WL1 to WL64, and the verify offset set may include the verify offsets VP1 to VPn respectively corresponding to first to nth program states. Controller 100 may select a verify offset set corresponding to an address ADDR in verify offset table 142 and may generate program command set 141 including the selected verify offset set.

Figure 15:
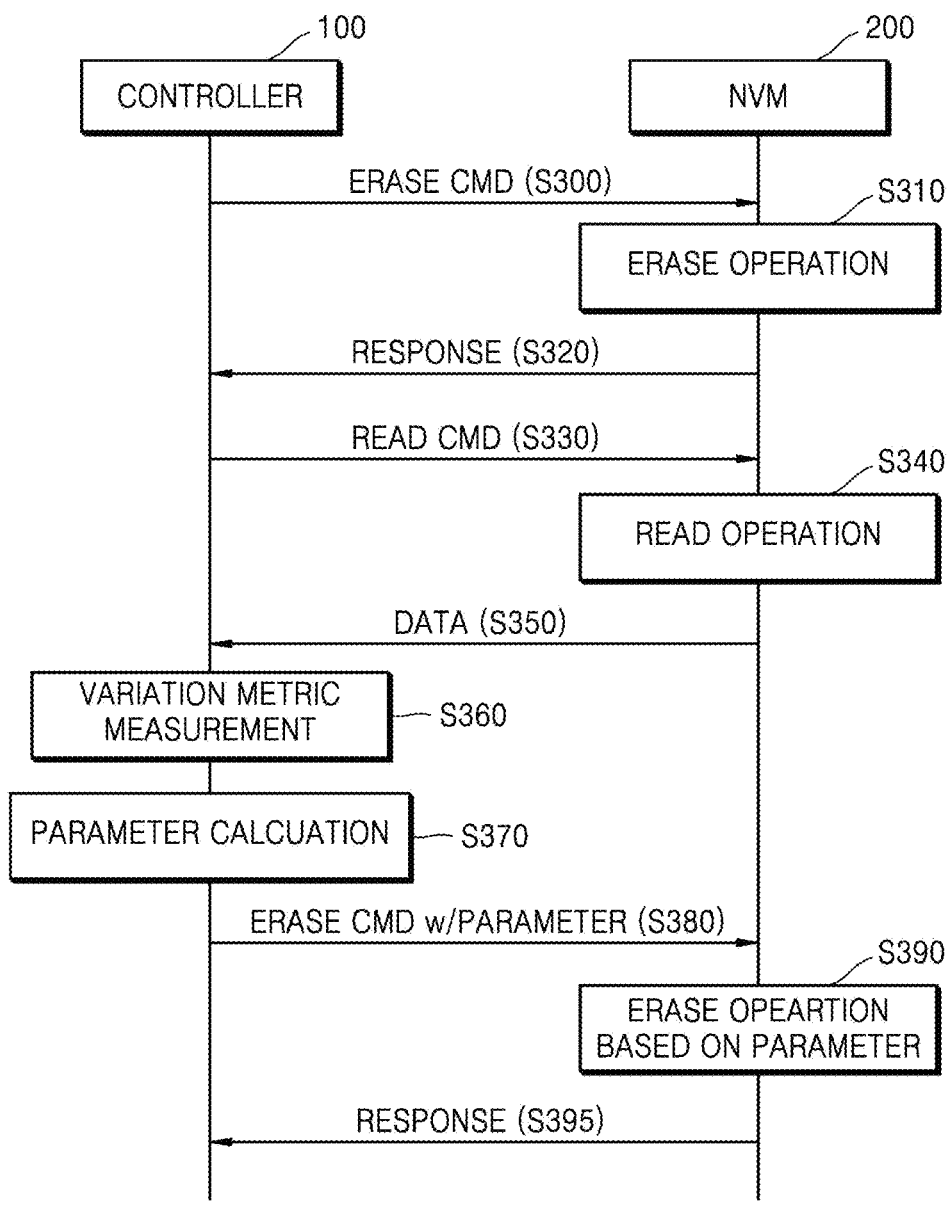
FIG. 15 is a flowchart illustrating an embodiment of an erase operation between a controller and a non-volatile memory.

FIG. 15 is a flowchart illustrating an embodiment of an erase operation between controller 100 and NVM 200. Referring to FIG. 15, an erase operation according to the present embodiment corresponds to a modified embodiment of the program operation of FIG. 12, and overlapping descriptions are omitted.

In operation S300, controller 100 may transmit an erase command to NVM 200. In operation S310, NVM 200 may perform an erase operation in response to the erase command In operation S320, NVM 200 may transmit a response message representing an erase end to controller 100. In operation S330, controller 100 may transmit a read command to NVM 200. In operation S340, NVM 200 may perform a read operation in response to the read command In operation S350, NVM 200 may transmit read data to controller 100.

In operation S360, controller 100 may measure a distribution variation metric of threshold voltage distributions between a plurality of memory units. In operation S370, controller 100 may calculate operation parameters (for example, erase operation parameters), based on the measured distribution variation metric. In operation S380, controller 100 may transmit an erase command and erase operation parameters to NVM 200. In operation S390, NVM 200 may perform an erase operation, based on the transmitted erase operation parameters. In operation S395, NVM 200 may transmit a response message representing an erase end to controller 100.

Figure 16:
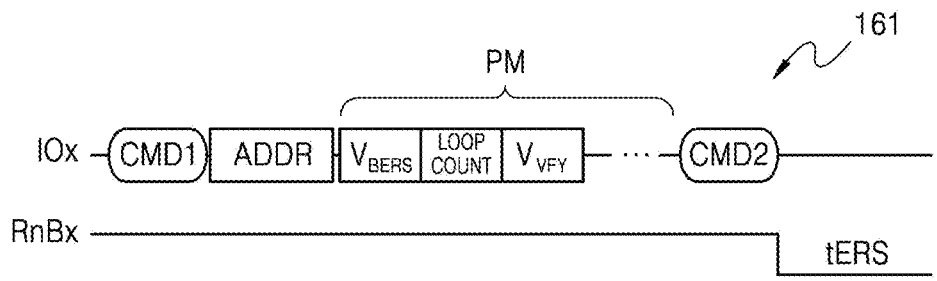
FIG. 16 illustrates an example embodiment of an erase command set.

FIG. 16 illustrates an example embodiment of an erase command set 161. Referring to FIGS. 1 and 16, an erase command set 161 may be transmitted through an I/O bus IOx between controller 100 and NVM 200. Erase command set 161 may include a first command CMD1, an address ADDR, an operation parameter PM, and a second command CMD2. Therefore, NVM 200 may sequentially receive the first command CMD1, the address ADDR, the operation parameter PM, and the second command CMD2.

The first command CMD1 may be an erase sequence start command, for example, 60 h. The second command CMD2 may be an erase sequence end command, for example, 70 h. The address ADDR may include, for example, row addresses having three clock cycles. The operation parameter PM may include an erase start voltage $V_{BERs}$, a loop count, and a program verify voltage $V_{VFY}$. When the second command CMD2 is received, a ready/busy signal RnBx of NVM 200 may be shifted from a high level to a low level, and thus, an operation of erasing a memory block corresponding to the received address ADDR may be performed during an erase time tERS.

Figure 17:
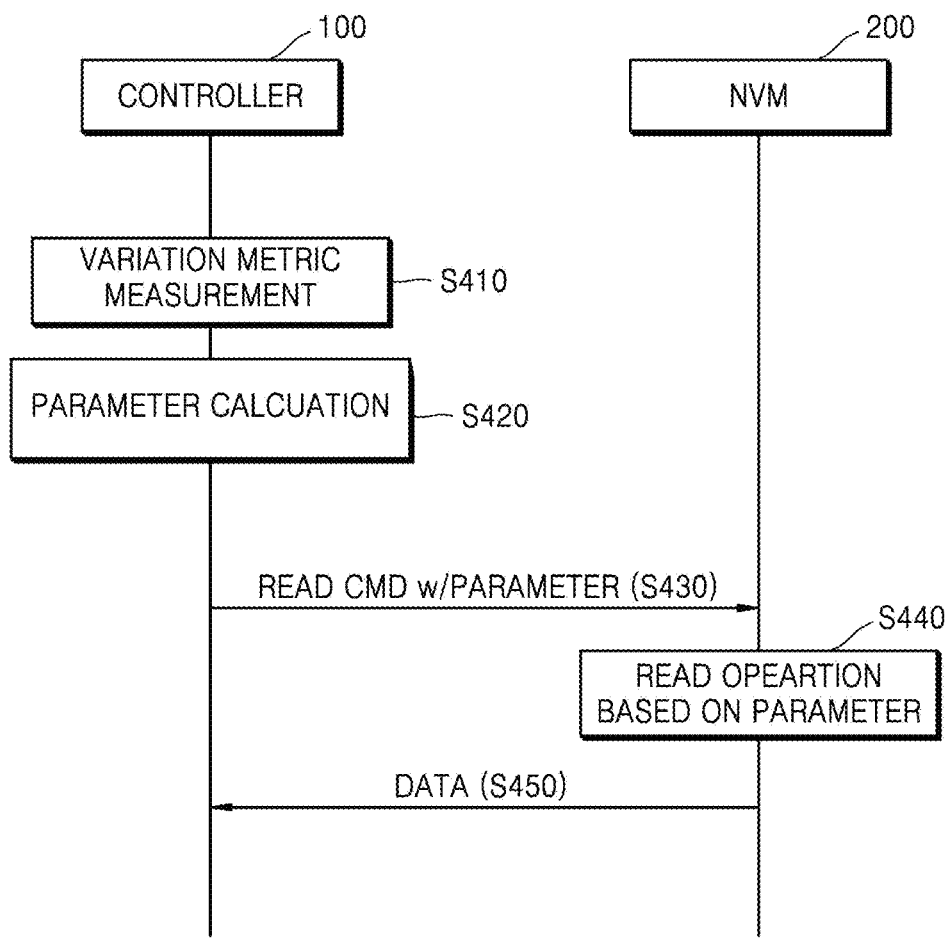
FIG. 17 is a flowchart illustrating an embodiment of a read operation between a controller and a non-volatile memory.

FIG. 17 is a flowchart illustrating an embodiment of a read operation between controller 100 and NVM 200.

Referring to FIG. 17, in operation S410, controller 100 may measure a distribution variation metric. In operation S420, controller 100 may calculate operation parameters (for example, read operation parameters) by using the measured distribution variation metric. In an embodiment, operations S200 to S250 of FIG. 12 may be performed before operation S410, and in operation S420, the read operation parameters may be calculated. In an embodiment, operations S300 to S350 of FIG. 15 may be performed before operation S410, and in operation S420, the read operation parameters may be calculated. For example, the read operation parameters may include read voltages for respectively reading first to nth program states. In operation S430, controller 100 may transmit a read command and the read operation parameters to NVM 200. In operation S440, NVM 200 may perform a read operation, based on the received read operation parameters. In operation S450, NVM 200 may transmit read data to controller 100.

Figure 18:
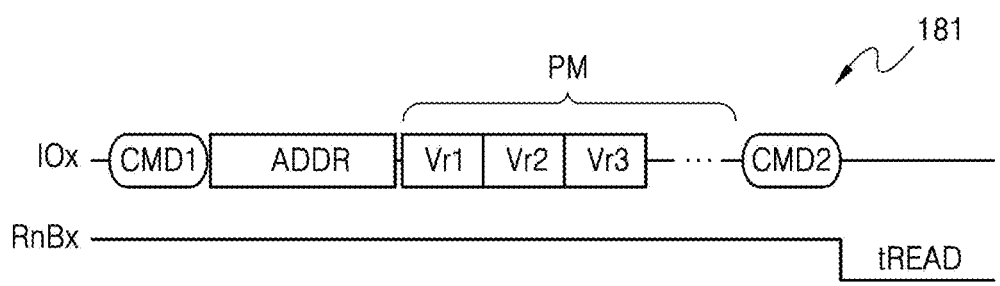
FIG. 18 illustrates an example embodiment of a read command set.

FIG. 18 illustrates an example embodiment of a read command set 181. Referring to FIGS. 1 and 18, a read program command set 181 may be transmitted through an I/O bus IOx between controller 100 and NVM 200. Read program command set 181 may include a first command CMD1, an address ADDR, an operation parameter PM, and a second command CMD2. Therefore, NVM 200 may sequentially receive the first command CMD1, the address ADDR, the operation parameter PM, and the second command CMD2.

The first command CMD1 may be a read sequence start command, for example, ooh. The second command CMD2 may be a read sequence end command, for example, 30 h. The address ADDR may include, for example, column addresses having two cycles and row addresses having three cycles. The operation parameter PM may include a plurality of read start voltages Vr1 to Vr3. When the second command CMD2 is received, a ready/busy signal RnBx of NVM 200 may be shifted from a high level to a low level, and thus, an operation of reading data DATA from memory cells having the received address ADDR may be performed during a read time tREAD.

Figure 19:
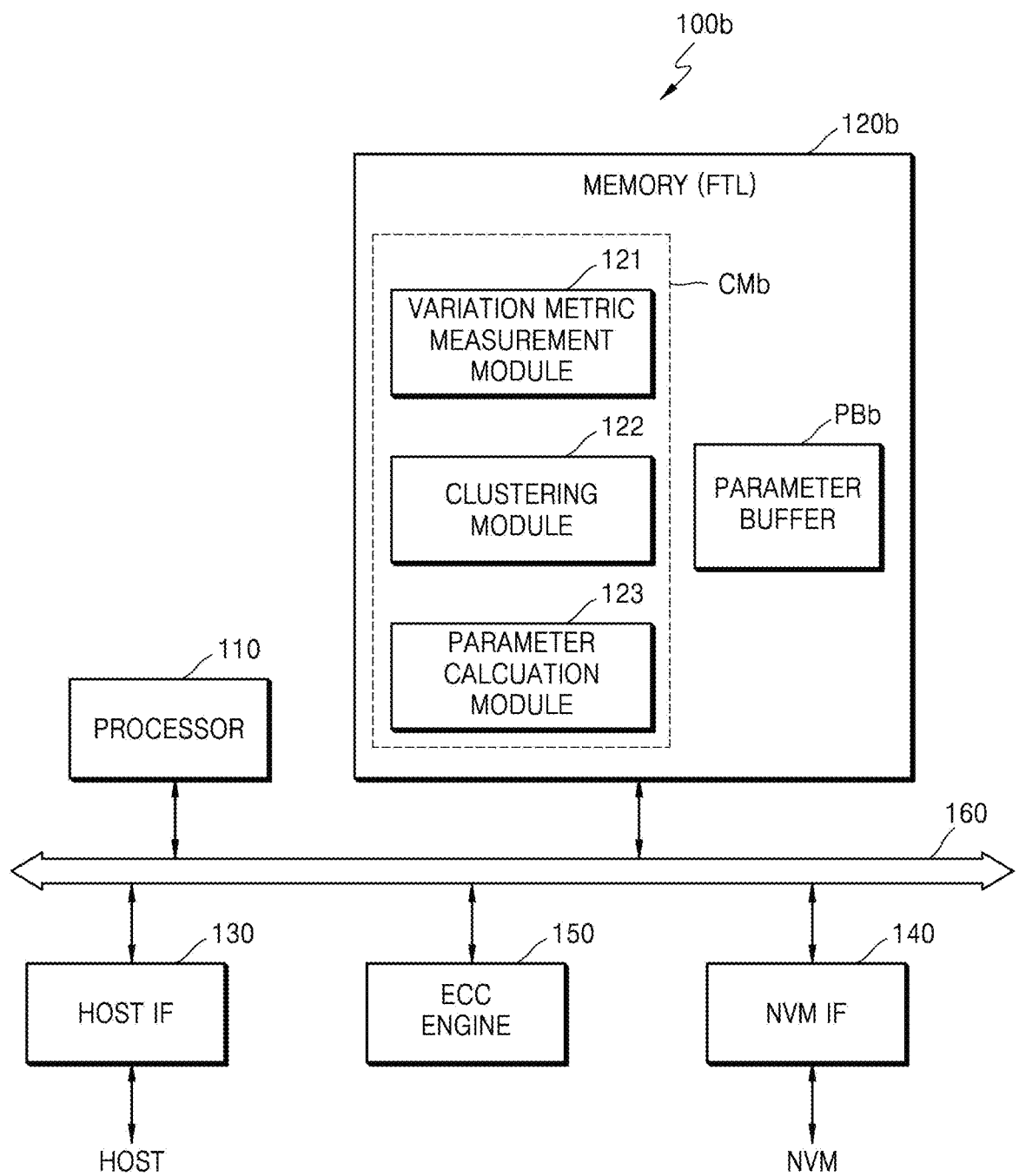
FIG. 19 is a block diagram illustrating another example embodiment of a controller of FIG. 1.

FIG. 19 is a block diagram illustrating another example embodiment of a controller of FIG. 1.

Referring to FIG. 19, a controller 100b may correspond to a modified embodiment of controller 100a of FIG. 5, and details described above with reference to FIG. 5 may be applied to the present embodiment. According to the present embodiment, a calibration module CMb may be loaded into a memory 120b and may further include a clustering module 122 in comparison with the calibration module CMa of FIG. 5. clustering module 122 may group a plurality of memory units into a plurality of groups, based on a distribution variation metric. In detail, clustering module 122 may receive a distribution variation metric from a variation metric measurement module 121 of the calibration module CMb and may group the plurality of memory units into the plurality of groups through clustering based on the received distribution variation metric.

In an embodiment, clustering module 122 may perform clustering based on a plurality of distribution variation metrics through machine learning and may group the plurality of memory units into the plurality of groups, based on a result of the clustering. For example, clustering module 122 may perform the clustering by using at least one of a k-means clustering algorithm, a K-medoids clustering algorithm, a hierarchical clustering algorithm, a density-based clustering algorithm, and a neural network algorithm. Hereinafter, an operation of clustering module 122 will be described in more detail with reference to FIG. 20.

Figure 20:
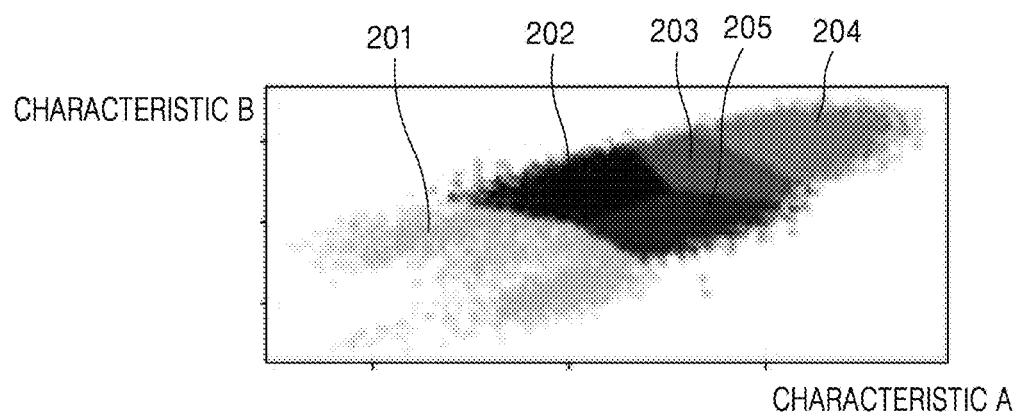
FIG. 20 is a graph showing an embodiment of a clustering operation.

FIG. 20 is a graph showing an embodiment of a clustering operation. Referring to FIG. 20, the abscissa axis represents a characteristic A, and the ordinate axis represents a characteristic B. For example, the characteristic A and the characteristic B may be different distribution variation metrics. A plurality of threshold voltage distributions respectively corresponding to a plurality of memory units may be clustered based on the different distribution variation metrics, and the plurality of memory units may be grouped into a plurality of groups 201 to 205, based on a result of the clustering. In FIG. 20, an embodiment of performing clustering based two characteristics is illustrated, but the present embodiment is not limited thereto. In some embodiments, clustering module 122 may perform clustering, based on three or more characteristics.

Figure 21A:
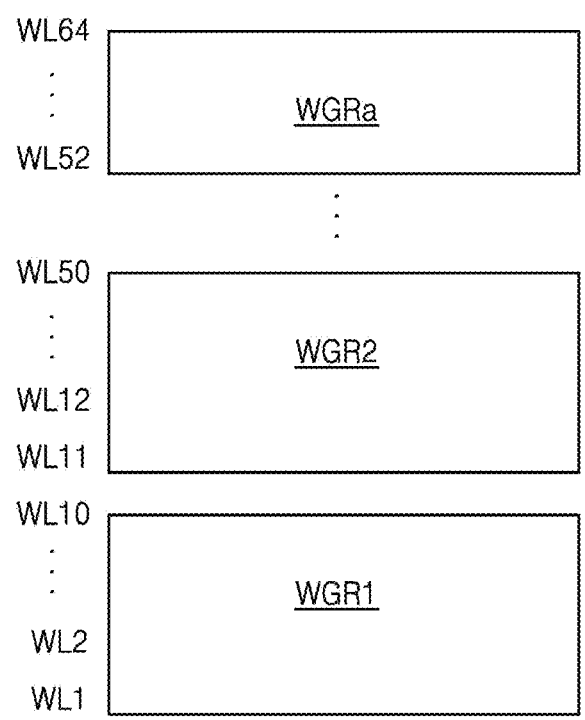
FIG. 21A illustrates an embodiment of word line groups.
Figure 21B:
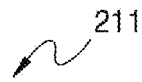
FIG. 21B illustrates an embodiment of a verify offset.
Figure 21C:
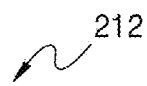
FIG. 21C illustrates an embodiment of a read voltage table.

FIG. 21A illustrates an embodiment of word line groups, FIG. 21B illustrates an embodiment of a verify offset table 211, and FIG. 21C illustrates an embodiment of a read voltage table 212. Hereinafter, a word line grouping operation will be described with reference to FIGS. 19 and 21A to 21C. Clustering module 122 may group a plurality of word lines WL1 to WL64 into a plurality of word line groups WGR1 to WGRa, based on a distribution variation metric. Here, "a" may be a positive integer equal to or more than two.

In an embodiment, a parameter calculation module 123 of the calibration module CMb may ascertain or determine a plurality of verify offsets VP1 to VPn for the plurality of word line groups WGR1 to WGRa, and the parameter buffer PB may store verify offset table 211 which includes the plurality of verify offsets VP1 to VPn for the plurality of word line groups WGR1 to WGRa. For example, the same verify offsets may be applied for each of the word lines included in a first word line group WGR1, and thus, a program operation on the word lines included in the first word line group WGR1 may be performed by using the same verify offsets. Also, a program operation on each of word lines included in a second word line group WGR2 may be performed by using verify offsets which are different from the verify offsets which are used in the program operation on the word lines included in the first word line group WGR1. As described above, a program operation may be performed by using different verify offsets for different word line groups, thereby decreasing a distribution variation between the different word line groups.

In an embodiment, parameter calculation module 123 may ascertain or determine a plurality of read voltage Vr1 to Vr3 for the plurality of word line groups WGR1 to WGRa, and the parameter buffer PB may store the read voltage table 212. For example, the same read voltages may be applied for each of the word lines included in the first word line group WGR1, and thus, a read operation on each of the word lines included in the first word line group WGR1 may be performed by using the same read voltages. Also, a read operation on each of the word lines included in the second word line group WGR2 may be performed by using read voltages which are different from the read voltages which are used in the read operation on the word lines included in the first word line group WGR1. As described above, a read operation may be performed by using different read voltages for different word line groups, thereby decreasing a read error caused by a distribution variation between the different word line groups.

Figure 22A:
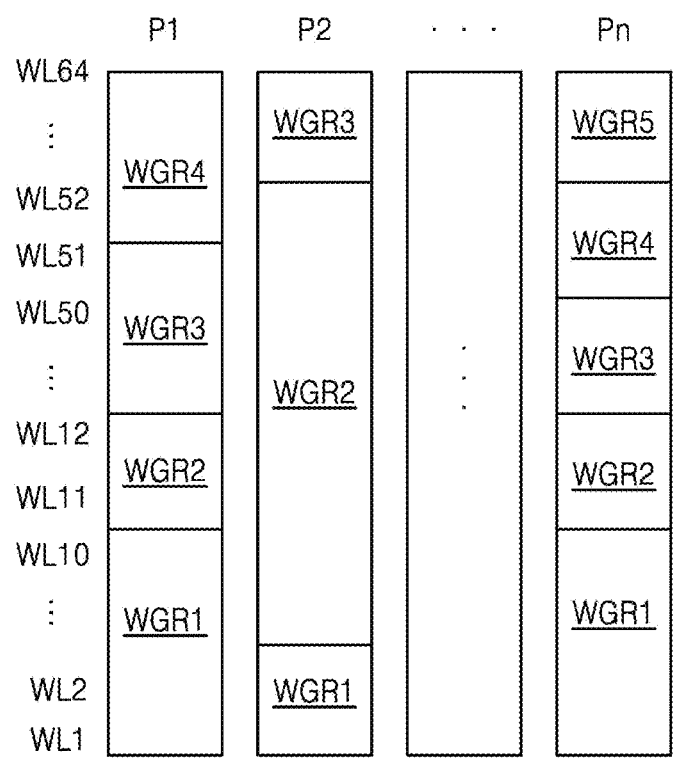
FIG. 22A illustrates an embodiment of word line groups.
Figure 22B:
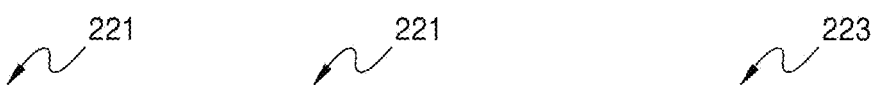
FIG. 22B illustrates an embodiment of a verify offset table.
Figure 22C:
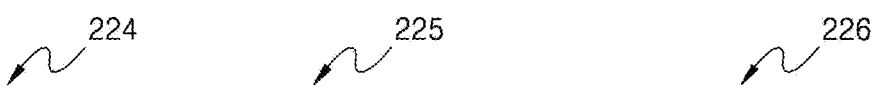
FIG. 22C illustrates an embodiment of a read voltage table.

FIG. 22A illustrates an embodiment of word line groups, FIG. 22B illustrates an embodiment of verify offset tables 221 to 223, and FIG. 22C illustrates an embodiment of read voltage tables 224 to 226. Hereinafter, a word line grouping operation will be described with reference to FIGS. 19 and 22A to 22C. Clustering module 122 may group a plurality of word lines WL1 to WL64 into a plurality of word line groups WGR1 to WGRb, based on a distribution variation metric and a plurality of program states P1 to Pn. Here, "b" may be a positive integer equal to or more than two.

In an embodiment, clustering module 122 may group the plurality of word lines WL1 to WL64 into first to fourth word line groups WGR1 to WGR4 with respect to a first program state P1. Also, clustering module 122 may group the plurality of word lines WL1 to WL64 into the first to third word line groups WGR1 to WGR3 with respect to a second program state P2. Also, clustering module 122 may group the plurality of word lines WL1 to WL64 into first to fifth word line groups WGR1 to WGR5 with respect to an nth program state Pn. Therefore, the same word lines may be grouped into different word line groups, based on a program state. For example, a tenth word line WL10 may be included in the first word line group WGR1 with respect to the first program state P1 and may be included in the second word line group WGR2 with respect to the second program state P2.

In an embodiment, parameter calculation module 123 may ascertain or determine first verify offsets VP1 for the plurality of word line groups WGR1 to WGR4 with respect to the first program state P1, ascertain or determine second verify offsets VP2 for the plurality of word line groups WGR1 to WGR3 with respect to the second program state P2, and ascertain or determine nth verify offsets VPn for the plurality of word line groups WGR1 to WGR5 with respect to the nth program state Pn. The parameter buffer PB may store first to nth program verify offset tables 221 to 223. For example, a first verify offset (for example, −10) corresponding to the first word line group WGR1 may be used for programming the tenth word line WL10 to the first program state P1. Also, a second verify offset (for example, −70) corresponding to the second word line group WGR2 may be used for programming the tenth word line WL10 to the second program state P2. As described above, a program operation may be performed on the same word lines by using different verify offsets for different program states, thereby decreasing a distribution variation between different word line groups.

In an embodiment, parameter calculation module 123 may determine a first read voltage Vr1 for determining the first program state P1 with respect to a plurality of word lines WL1 to WL4, determine a second read voltage Vr2 for determining the second program state P2 with respect to a plurality of word lines WL1 to WL3, and determine an nth read voltage Vrn for determining the nth program state Pn with respect to a plurality of word lines WL1 to WL5. The parameter buffer PB may store first to nth read voltage tables 224 to 226.

Figure 23A:
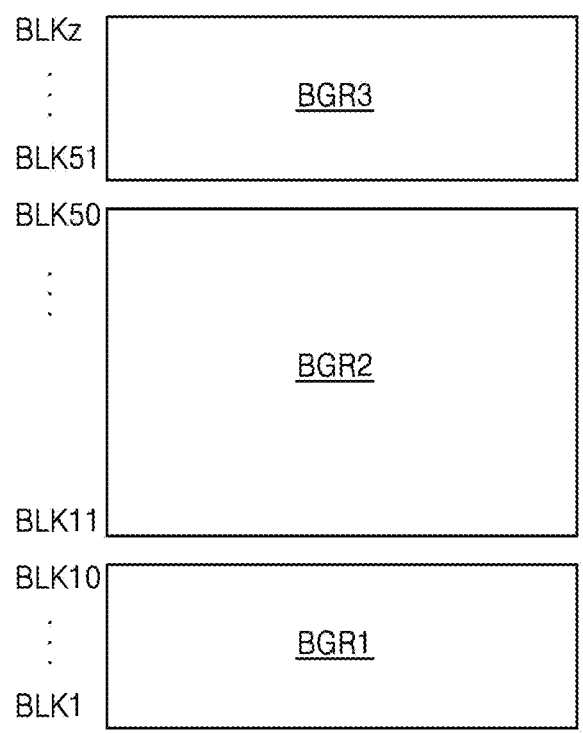
FIGS. 23A and 23B illustrate some exemplary embodiments of memory block groups according to some embodiments.
Figure 23B:
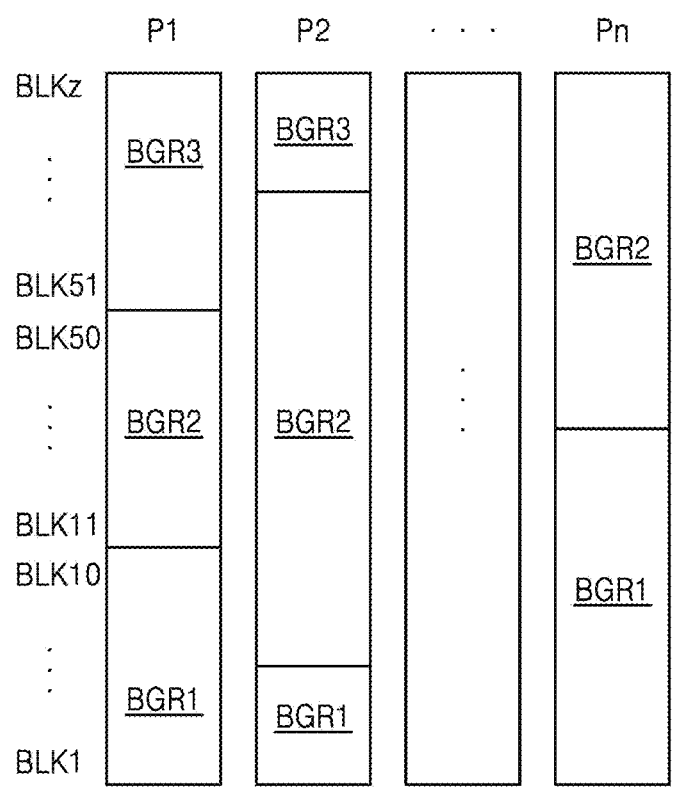

FIGS. 23A and 23B exemplarily illustrate a plurality of memory block groups BGR1 to BGR3 according to some embodiments. Referring to FIG. 23A, clustering module 122 may group a plurality of memory blocks BLK1 to BLKz into first to third memory block groups BGR1 to BGR3, based on a distribution variation metric. Referring to FIG. 23B, clustering module 122 may group the plurality of memory blocks BLK1 to BLKz into the first to third memory block groups BGR1 to BGR3 with respect to each of a plurality of program states P1 to Pn, based on a distribution variation metric and the plurality of program states P1 to Pn. In this case, the same memory blocks may be grouped into different memory block groups for different program states. For example, a 51st word line WL51 may be included in the third memory block group BGR3 with respect to the first program state P1 and may be included in the second memory block group BGR2 with respect to the second program state P2.

Figure 24A:
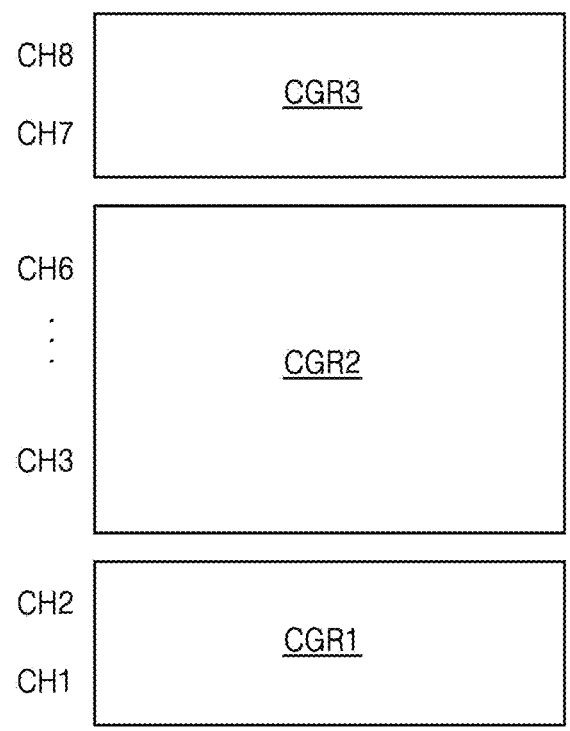
FIGS. 24A and 24B illustrate some exemplary embodiments of memory chip groups.
Figure 24B:
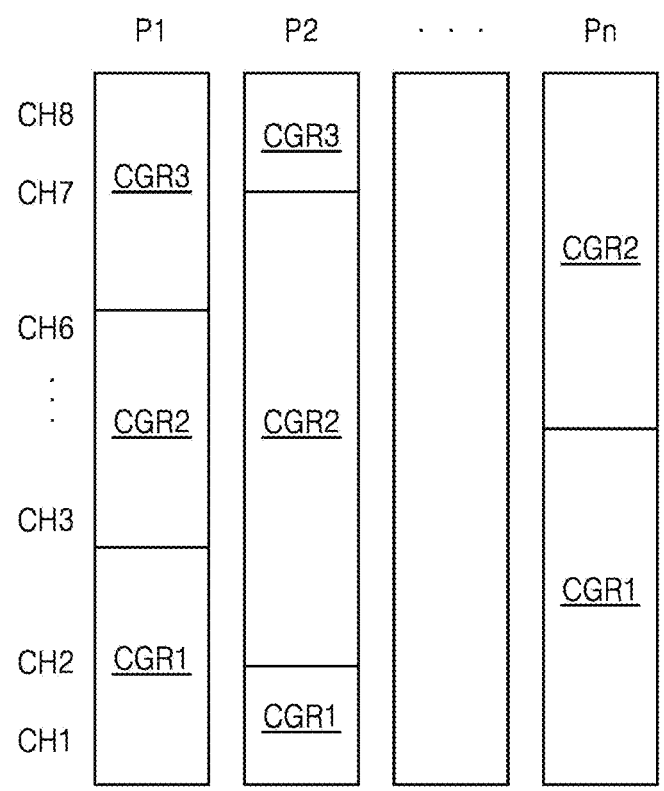

FIGS. 24A and 24B exemplarily illustrate memory chip groups according to some embodiments. Referring to FIG. 24A, clustering module 122 may group a plurality of memory chips CH1 to CH8 into first to third memory chip groups CGR1 to CGR3, based on a distribution variation metric. Referring to FIG. 24B, clustering module 122 may group the plurality of memory chips CH1 to CH8 into the first to third memory chip groups CGR1 to CGR3 with respect to each of a plurality of program states P1 to Pn, based on a distribution variation metric and the plurality of program states P1 to Pn. In this case, the same memory chips may be grouped into different memory chip groups for different program states. For example, a third memory chip CH3 may be included in the second memory chip group CGR2 with respect to the first program state P1 and may be included in the first memory chip group CGR1 with respect to the nth program state Pn.

Figure 25:
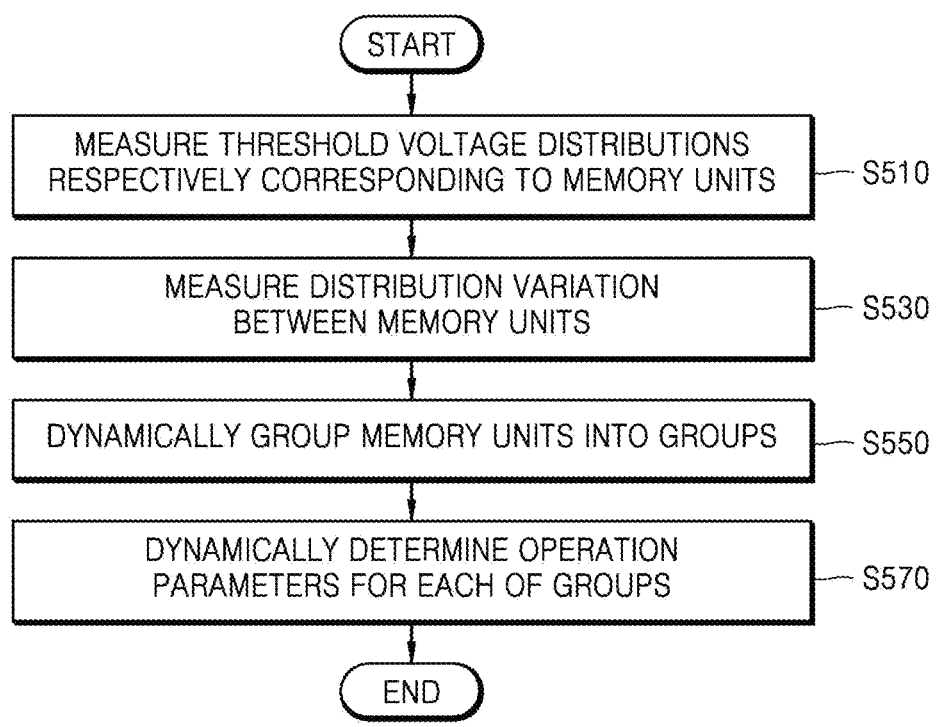
FIG. 25 is a flowchart illustrating an embodiment of an operating method of a storage device.

FIG. 25 is a flowchart illustrating an embodiment of an operating method of a storage device. Referring to FIG. 25, the operating method according to the present embodiment corresponds to a modified embodiment of the operating method of FIG. 11, and overlapping descriptions are omitted. In operation S510, a plurality of threshold voltage distributions respectively corresponding to a plurality of memory units may be measured. In operation S530, a distribution variation metric between the plurality of memory units may be measured. In operation S550, the plurality of memory units may be dynamically grouped into a plurality of groups. In operation S570, operation parameters may be dynamically ascertained or determined for each of the plurality of groups. In some embodiments, the operating method may further include a process of storing the operation parameters, respectively corresponding to the plurality of groups, in a volatile memory. In some embodiments, the operating method may further include a process of transmitting, by a controller to an NVM, an operate command, an address, and at least one operation parameter.

Figure 26:
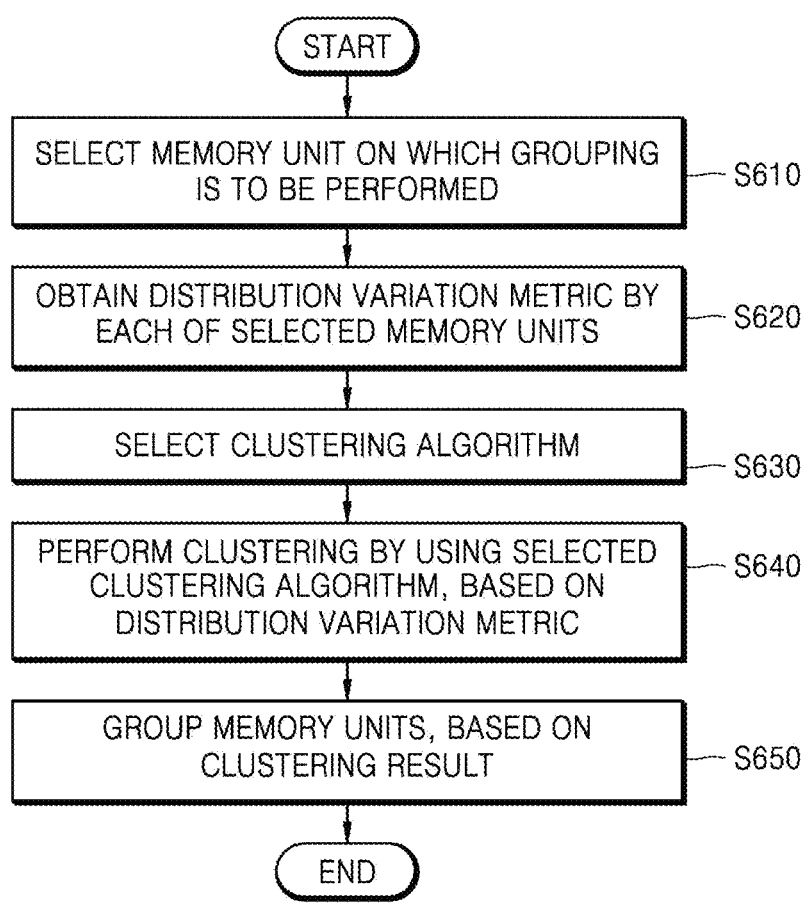
FIG. 26 is a flowchart illustrating an embodiment of a method of grouping memory units of a non-volatile memory.

FIG. 26 is a flowchart illustrating an embodiment of a method of grouping memory units of a non-volatile memory. Referring to FIG. 26, the grouping method according to the present embodiment may correspond to an implementation example of operation S550 of FIG. 25. In operation S610, a memory unit on which grouping is to be performed may be selected. In operation S620, a distribution variation metric may be obtained for each of selected memory units. In operation S630, a clustering algorithm may be selected. In operation S640, clustering may be performed based on the distribution variation metric by using the selected clustering algorithm. In operation S650, a plurality of memory units may be grouped based on a result of the clustering.

Figure 27:
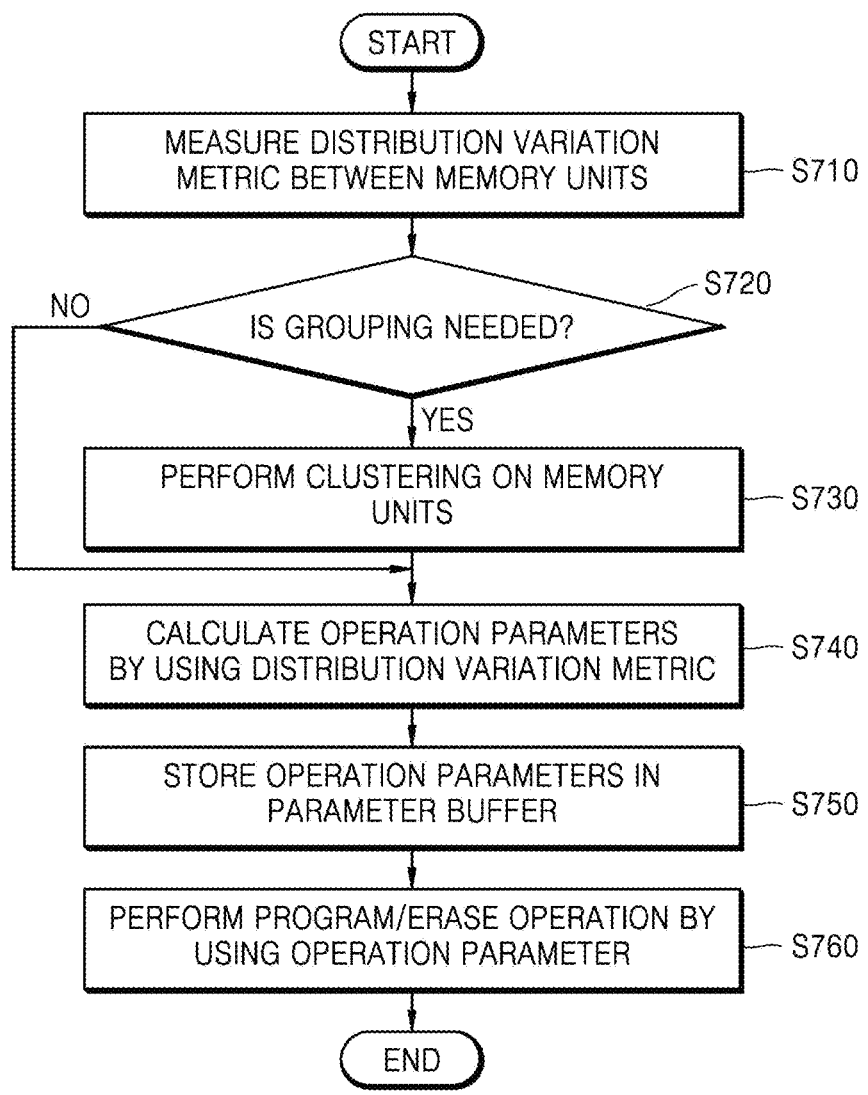
FIG. 27 is a flowchart illustrating an embodiment of an operating method of a storage device.

FIG. 27 is a flowchart illustrating an embodiment of an operating method of a storage device. Referring to FIG. 27, the operating method according to the present embodiment corresponds to a modified embodiment of the operating method of FIG. 11, and overlapping descriptions are omitted. In operation S710, a distribution variation metric between a plurality of memory units may be measured. In particular, whether grouping of the plurality of memory units is needed may be determined based on the measured distribution variation metric between the plurality of memory units. In operation S720, whether grouping of the plurality of memory units is needed may be determined. When it is determined that the grouping of the plurality of memory units is needed, operation S730 may be performed, and otherwise, operation S740 may be performed. In operation S730, clustering may be performed on the plurality of memory units. In operation S740, operation parameters may be calculated based on the distribution variation metric. In operation S750, the operation parameters may be stored in a parameter buffer. In operation S760, a program/erase operation may be performed based on the operation parameters.

Figure 28:
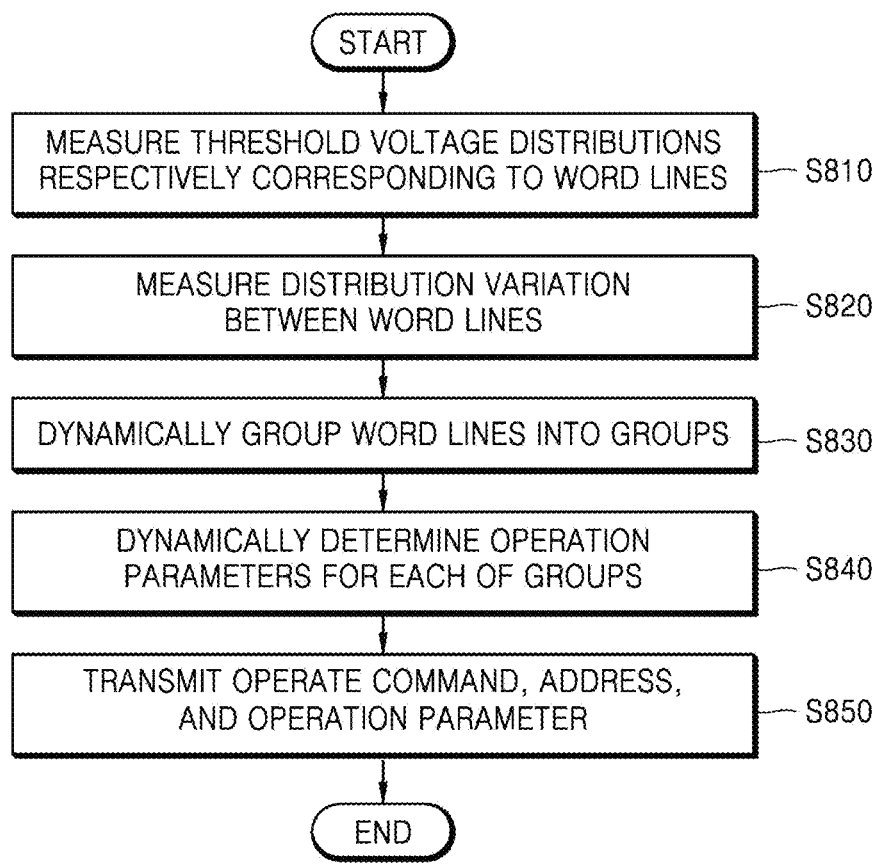
FIG. 28 is a flowchart illustrating an embodiment of an operating method of a storage device.

FIG. 28 is a flowchart illustrating an embodiment of an operating method of a storage device. Referring to FIG. 28, the operating method according to the present embodiment corresponds to a modified embodiment of the operating method of FIG. 11, and overlapping descriptions are omitted. In operation S810, a plurality of threshold voltage distributions respectively corresponding to a plurality of word lines may be measured. In operation S820, a distribution variation metric between the plurality of word lines may be measured. In operation S830, the plurality of word lines may be dynamically grouped into a plurality of groups. In operation S840, operation parameters may be dynamically determined for each of the plurality of groups. In operation S850, an operate command, an address, and the operation parameters may be transmitted to an NVM.

Figure 29:
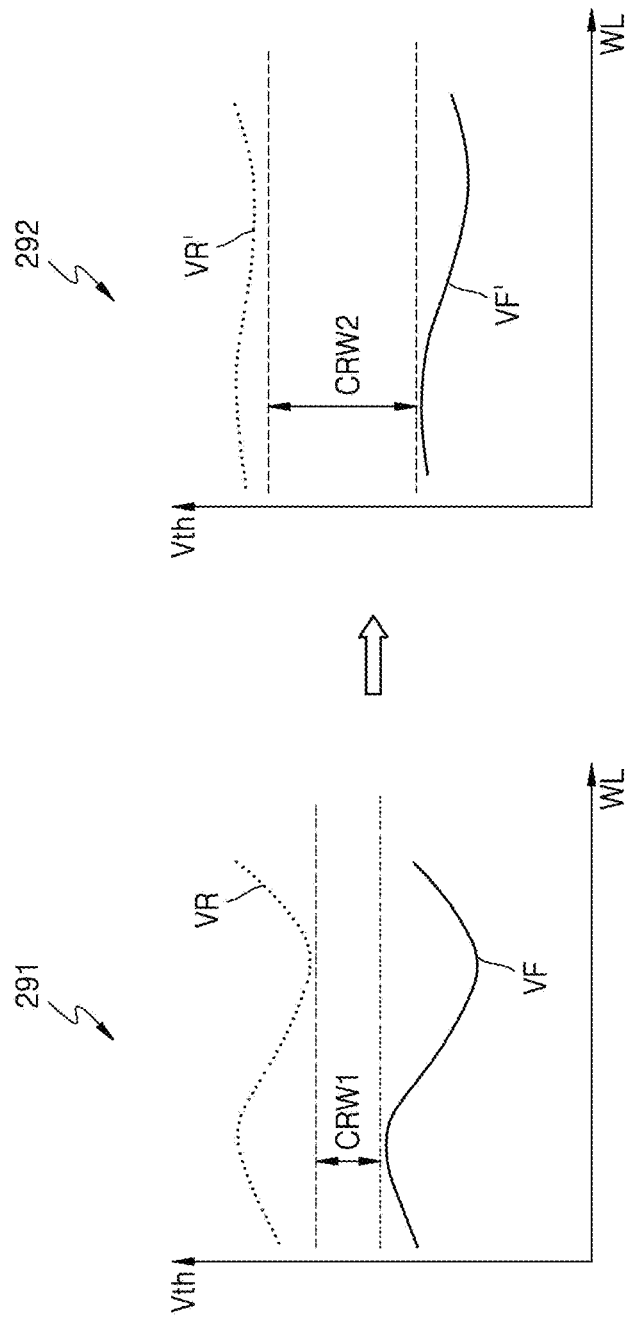
FIG. 29 shows graphs showing variations of a rising voltage and a falling voltage with respect to word lines, according to an embodiment.

FIG. 29 is a graph showing variations of a rise voltage and a fall voltage with respect to word lines according to an embodiment. Referring to FIG. 29, a first graph 291 shows rise voltages VR of memory cells, programmed to an nth program state, of a plurality of memory cells included in a first memory block BLK1 and fall voltages VF of memory cells programmed to an n−1st program state. A second graph 292 shows a result obtained by adjusting operation parameters for word lines so as to decrease a distribution variation between the word lines, according to embodiments. In detail, in second graph 292, a rise voltage YR' and a fall voltage VF' has a difference caused by the word lines, and thus, a second common read window CRW2 may be greater than a first common read window CRW1.

Figure 30:
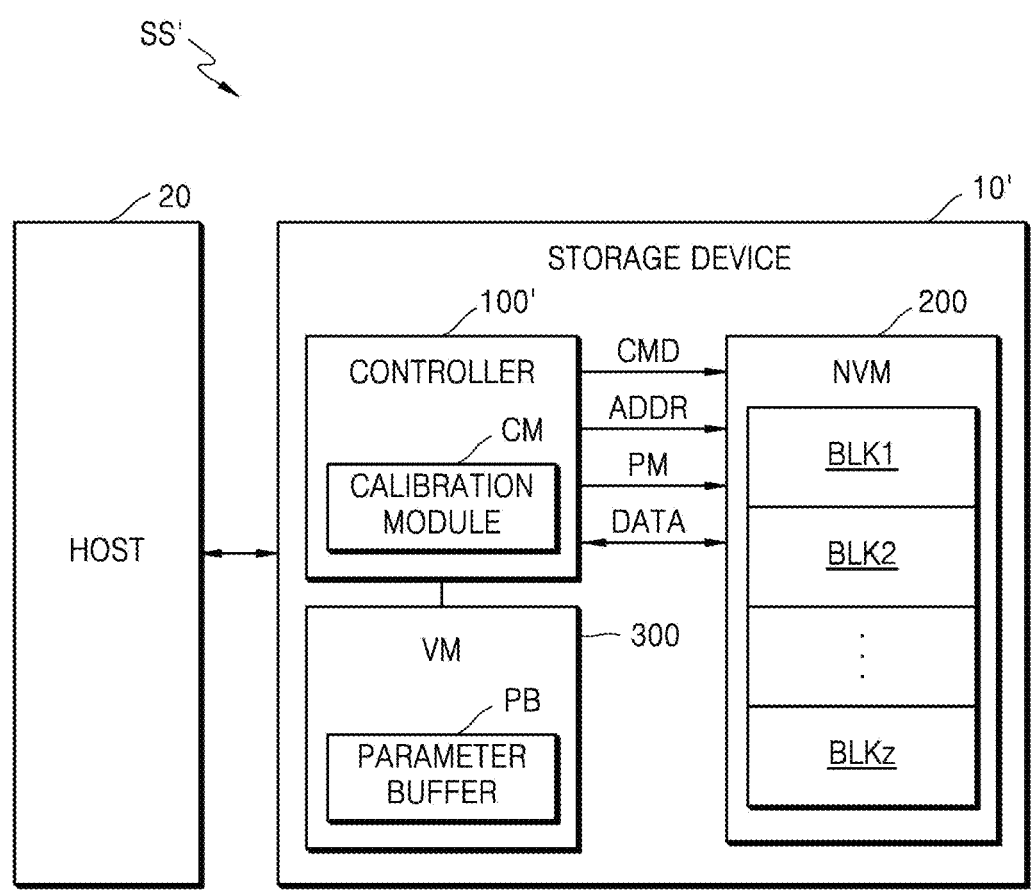
FIG. 30 is a block diagram illustrating an embodiment of a storage system.

FIG. 30 is a block diagram illustrating an embodiment of a storage system SS'. Referring to FIG. 30, a storage device 10' may include a controller 100', an NVM 200, and a volatile memory 300. Controller 100' may include a calibration module CM, and volatile memory 300 may store a parameter buffer PB. For example, volatile memory 300 may be implemented as DRAM or SRAM.

Figure 31:
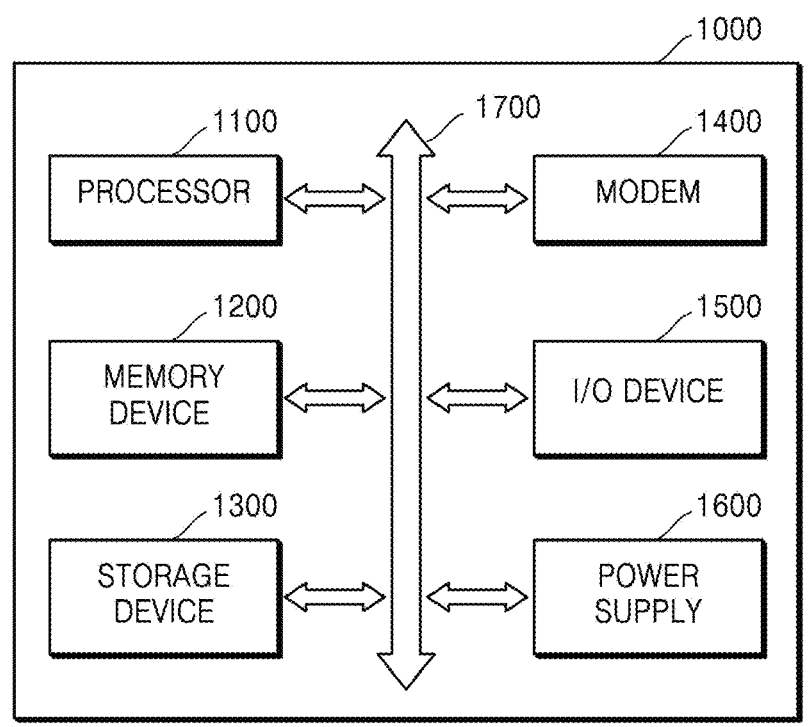
FIG. 31 is a block diagram illustrating an embodiment of an electronic device.

FIG. 31 is a block diagram illustrating an embodiment of an electronic device 1000. Electronic device 1000 may include a processor 1100, a memory device 1200, a storage device 1300, a modem 1400, an I/O device 1500, and a power supply 1600. In the present embodiment, storage device 1300 may dynamically determine operation parameters, based on a distribution variation between a plurality of memory units and may perform a program or erase operation, based on the determined operation parameters. Storage device 1300 may be implemented based on details described above with reference to FIGS. 1 to 30.

The various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While the inventive concept has been particularly shown and described with reference to embodiments thereof, it will be understood that various changes in form and details may be made therein without departing from the spirit and scope of the following claims.

What is claimed is:

1. An operating method of a storage device including a non-volatile memory and a controller controlling the non-volatile memory, the operating method comprising:
    receiving, by the controller, read data from the non-volatile memory;
    measuring, by the controller, a plurality of threshold voltage distributions respectively corresponding to a plurality of memory units of the non-volatile memory, based on the received read data;
    measuring, by the controller, a distribution variation between the plurality of memory units, based on the measured plurality of threshold voltage distributions;
    dynamically determining, by the controller, operation parameters for the non-volatile memory, based on the measured distribution variation; and
    transmitting, by the controller to the non-volatile memory, an operate command, an address, and at least one of the operation parameters, corresponding to the address,
    wherein the non-volatile memory comprises a first memory chip and a second memory chip, and
    wherein the dynamically determining comprises determining, by the controller, first operation parameters corresponding to the first memory chip, and determining, by the controller, second operation parameters corresponding to the second memory chip.

2. The operating method of claim 1, wherein the operate command is a program command, and the at least one operation parameter comprises at least one of a program start voltage, a program loop count, and a program verify voltage.

3. The operating method of claim 1, wherein the operate command is a program command, and the at least one operation parameter comprises a plurality of operation parameters respectively corresponding to a plurality of program states.

4. The operating method of claim 1, wherein the operate command is an erase command, and the at least one operation parameter comprises at least one of an erase start voltage, an erase loop count, and an erase verify voltage.

5. The operating method of claim 1, further comprising the controller dynamically grouping the plurality of memory units into a plurality of groups, based on the measured distribution variation,
wherein the dynamically determining comprises dynamically determining, by the controller, the operation parameters for each of the plurality of groups.

6. The operating method of claim 5, wherein:
the dynamically grouping of the plurality of memory units into the plurality of groups is further based on a plurality of read voltage levels for respectively determining a plurality of different program states, and
a first memory unit of the plurality of memory units is grouped into a first group for a first read voltage level and is grouped into a second group for a second read voltage level, wherein at least one of the memory units included in the first group is not included in the second group or at least one of the memory units included in the second group is not included in the first group.

7. The operating method of claim 5, wherein the dynamically grouping comprises:
ascertaining a distribution variation metric corresponding to the measured distribution variation; and
grouping the plurality of memory units into the plurality of groups through clustering based on the distribution variation metric.

8. The operating method of claim 7, wherein the distribution variation metric comprises a first threshold voltage level at which a number of on cells of programmed memory cells in each of the plurality of memory units corresponds to a first number, or a second threshold voltage level at which a number of off cells of the programmed memory cells in each of the plurality of memory units corresponds to a second number.

9. The operating method of claim 7, wherein the distribution variation metric comprises a number of on cells of memory cells programmed based on a first word line voltage level in each of the plurality of memory units or a number of off cells of the memory cells programmed based on the first word line voltage level in each of the plurality of memory units.

10. The operating method of claim 7, wherein the distribution variation metric comprises a read voltage level for minimizing bit errors in each of the plurality of memory units.

11. The operating method of claim 7, wherein the clustering is performed by using at least one of a k-means clustering algorithm, a K-medoids clustering algorithm, a hierarchical clustering algorithm, a density-based clustering algorithm, and a neural network algorithm.

12. The operating method of claim 1, wherein:
the first memory chip comprises a first memory block and a second memory block, and
the dynamically determining of the first operation parameters comprises:
determining, by the controller, first operation parameters corresponding to the first memory block; and
determining, by the controller, operation parameters corresponding to the second memory block.

13. The operating method of claim 1, wherein:
the first memory chip comprises a first word line and a second word line, and
the dynamically determining of the first operation parameters comprises:
determining, by the controller, operation parameters corresponding to the first word line; and
determining, by the controller, operation parameters corresponding to the second word line.

14. An operating method of a storage device including a non-volatile memory and a controller controlling the non-volatile memory, the operating method comprising:
receiving, by the controller, read data from the non-volatile memory;
measuring, by the controller, a plurality of threshold voltage distributions respectively corresponding to a plurality of memory units of the non-volatile memory, based on the received read data;
measuring, by the controller, a distribution variation metric between the plurality of memory units, based on the measured plurality of threshold voltage distributions;
dynamically grouping, by the controller, the plurality of memory units into a plurality of groups through clustering based on the measured distribution variation metric; and
dynamically determining, by the controller, operation parameters for the non-volatile memory for each of the plurality of groups,
wherein the non-volatile memory comprises a first memory chip and a second memory chip, and
wherein the dynamically determining comprises dynamically determining, by the controller, first operation parameters corresponding to the first memory chip, and dynamically determining, by the controller, second operation parameters corresponding to the second memory chip.

15. The operating method of claim 14, wherein
the storage device further includes a volatile memory, and
the operating method further comprises storing, in the volatile memory, the operation parameters respectively corresponding to the plurality of groups.

16. The operating method of claim 14, wherein the distribution variation metric comprises at least one of: a first threshold voltage level at which a number of on cells of programmed memory cells in each of the plurality of memory units corresponds to a first number, a second threshold voltage level at which a number of off cells of the programmed memory cells in each of the plurality of memory units corresponds to a second number, a number of on cells of memory cells programmed based on a first word line voltage level in each of the plurality of memory units, a number of off cells of the memory cells programmed based on the first word line voltage level in each of the plurality of memory units, and a read voltage level for minimizing bit errors in each of the plurality of memory units.

17. A device, comprising:
a non-volatile memory including a plurality of non-volatile memory cells arranged in a plurality of memory units, wherein the non-volatile memory comprises a first memory chip and a second memory chip; and
a controller configured to:
measure a plurality of threshold voltage distributions respectively corresponding to the plurality of memory units of the non-volatile memory;

measure a distribution variation between the plurality of memory units, based on the measured plurality of threshold voltage distributions; and dynamically determine operation parameters for the non-volatile memory for each of the plurality of memory units, based on the measured distribution variation, wherein the dynamically determining comprises dynamically determining, by the controller, first operation parameters corresponding to the first memory chip, and dynamically determining, by the controller, second operation parameters corresponding to the second memory chip.

18. The device of claim 17, wherein the controller is configured to determine operation parameters for each of the plurality of memory units by:

dynamically grouping the plurality of memory units into a plurality of groups through clustering based on the measured distribution variation; and dynamically determining the operation parameters for each of the plurality of groups based on the measured distribution variation.

19. The device of claim 18, wherein the controller is configured to perform the clustering by using at least one of a k-means clustering algorithm, a K-medoids clustering algorithm, a hierarchical clustering algorithm, a density-based clustering algorithm, and a neural network algorithm.

20. The operating method of claim 14, wherein the clustering is performed by using at least one of a k-means clustering algorithm, a K-medoids clustering algorithm, a hierarchical clustering algorithm, a density-based clustering algorithm, and a neural network algorithm.

* * * * *